(12) United States Patent
Ota et al.

(10) Patent No.: US 7,614,144 B2
(45) Date of Patent: Nov. 10, 2009

(54) COMPONENT MOUNTING APPARATUS

(75) Inventors: Hiroshi Ota, Saga-ken (JP); Nobuhiro Nakai, Fukuoka-ken (JP); Kensuke Kawasumi, Osaka-fu (JP); Kimio Iizuka, Saga-ken (JP); Hirotsugu Uemori, Osaka-fu (JP); Yoshinori Mochida, Saga-ken (JP); Keizo Izumida, Saga-ken (JP)

(73) Assignee: Panasonic Corporation, Osaka (JP)

( * ) Notice: Subject to any disclaimer, the term of this patent is extended or adjusted under 35 U.S.C. 154(b) by 266 days.

(21) Appl. No.: 10/556,064

(22) PCT Filed: May 11, 2004

(86) PCT No.: PCT/JP2004/006596

§ 371 (c)(1),
(2), (4) Date: Oct. 23, 2006

(87) PCT Pub. No.: WO2004/103053

PCT Pub. Date: Nov. 25, 2004

(65) Prior Publication Data

US 2007/0074390 A1    Apr. 5, 2007

(30) Foreign Application Priority Data

May 13, 2003 (JP) ............................... 2003-134101
May 27, 2003 (JP) ............................... 2003-148676

(51) Int. Cl.
*H05K 3/30* (2006.01)
(52) U.S. Cl. .............................. 29/833; 29/712; 29/720; 29/739; 29/740; 29/742; 356/152.2; 356/237.1; 356/614

(58) Field of Classification Search ................... 29/833, 29/593, 712, 720, 739, 740, 742, 743, 759, 29/832, 834; 356/152.2, 237.1, 614
See application file for complete search history.

(56) References Cited

U.S. PATENT DOCUMENTS 5,724,722 A    3/1998    Hashimoto
(Continued)

FOREIGN PATENT DOCUMENTS

EP    0 725 560    8/1996
(Continued)

OTHER PUBLICATIONS

Supplementary European Search Report (in English language) issued May 8, 2008.

*Primary Examiner*—Thiem Phan
(74) *Attorney, Agent, or Firm*—Wenderoth, Lind & Ponack, L.L.P.

(57) ABSTRACT

The present invention is intended to realize a hold posture inspection of a plurality of components sucked by a plurality of nozzle rows provided on a head with a single scanning operation, thereby reducing the time for the hold posture inspection and improving the accuracy thereof. In order to achieve such objections, the present invention includes: a head on which at least two nozzle rows are disposed, each of which includes at least one nozzle; a circuit board holding unit for holding a circuit board on which components conveyed by the head are mounted; and an inspection unit, provided on a moving path of the head from a supplying unit to the circuit board holding unit, for inspecting hold postures of the components held by the nozzles of the head and including sensors for posture inspection independent for the respective nozzle rows.

4 Claims, 27 Drawing Sheets

U.S. PATENT DOCUMENTS

| | | | |
|---|---|---|---|
| 5,864,944 A | 2/1999 | Kashiwagi et al. | |
| 6,211,958 B1 | 4/2001 | Hachiya et al. | |
| 6,496,272 B1 | 12/2002 | Watanabe | |
| 6,606,790 B2 * | 8/2003 | Hidese | 29/832 |
| 2003/0029033 A1 | 2/2003 | Hidese et al. | |
| 2003/0133603 A1 | 7/2003 | Mitsumoto et al. | |

FOREIGN PATENT DOCUMENTS

| | | |
|---|---|---|
| EP | 0 854 671 | 7/1998 |
| EP | 0 994 646 | 4/2000 |
| JP | 6-216584 | 8/1994 |
| JP | 6-79199 | 11/1994 |
| JP | 11-68395 | 3/1999 |
| JP | 2000-27800 | 1/2000 |
| JP | 2000-156600 | 6/2000 |
| JP | 2000-278000 | 10/2000 |
| JP | 2001-230597 | 8/2001 |
| JP | 2003-60395 | 2/2003 |
| JP | 2003-60397 | 2/2003 |
| JP | 2003-124700 | 4/2003 |

* cited by examiner

COMPONENT MOUNTING APPARATUS

BACKGROUND OF THE INVENTION

1. Field of the Invention

The present invention relates to a component mounting apparatus for mounting components such as electronic components on a board such as a circuit board.

2. Description of the Related Art

Conventionally, an electronic component mounting apparatus has been so configured that components supplied from a supplying unit are taken out by being sucked with nozzles of a head, and conveyed onto a circuit board held by a circuit board holding unit, and then, mounted on the circuit board. The hold postures of the components sucked and held by the nozzles are inspected by an inspection unit provided on a moving path of the head, and based on the inspection results, the hold postures of the components are corrected as required and then a mounting operation is performed.

The head is provided with a plurality of nozzles. When the hold postures of the components sucked by the nozzles are inspected by the inspection unit, image information for each of the components sucked by the plural nozzles is not taken one by one and inspected, but plural pieces of image information for the plural nozzles, that is, plural pieces of image information for plural components are taken and inspected collectively by one sensor provided in the inspection unit so as to reduce the time required for hold posture inspection.

Further, when the hold posture inspection is performed to the components sucked by the nozzles, the head moves above the inspection unit. By using a line sensor or an area sensor with a shutter function, the hold posture inspection of the components sucked by the nozzles is performed in which the head is moving without being stopped above the inspection unit (hereinafter, an operation of taking image information of components sucked by the nozzles while moving the head without being stopped above the inspection unit and performing a hold posture inspection is called a scanning operation), whereby a time required for the hold posture inspection is reduced (for example, see Japanese Unexamined Patent Publication No. 1997-186492).

An exemplary operation of detecting an electronic component height in a conventional electronic component mounting apparatus will be briefly explained below with reference to FIG. 36.

An electronic component mounting apparatus 1020 shown in FIG. 36 is an example of a component mounting apparatus of a so-called robot type in which a head part with nozzles holding electronic components moves in X and Y directions to thereby perform operation from holding of components to mounting them on a circuit board 1008. The electronic component mounting apparatus 1020 includes: a supplying unit 1002 for supplying electronic components 1001; a head part 1004 with a plurality of mounting nozzles 1003 for taking out the electronic components 1001 from the supplying unit 1002; a recognizing unit 1005 for recognizing postures of the electronic components 1001 held by the mounting nozzles 1003 in a planar manner; an electronic component height detecting unit 1006, having a light emitting unit for emitting parallel luminous flux and a light receiving unit for receiving the parallel luminous flux, for detecting the heights of the electronic components 1001 held by the mounting nozzles 1003; a control unit 1007 for correcting the postures of the electronic components 1001 based on the recognition result from the recognizing unit 1005, and determining good/bad quality of the postures of the components 1001 based on the detection result from the electronic component height detecting unit 1006; and a robot 1009 for moving the head part 1004 in X and Y directions from the supplying unit 1002 to a component mounting position on the circuit board 1008.

Further, as shown in FIG. 37, a plurality of mounting nozzles 1003 are aligned in one row on the head part 1004, and the element component height detecting unit 1006 is arranged in an orthogonal direction to detection moving direction α of the head part 1004.

Hereinafter, an operation of detecting electronic component height in the conventional electronic component mounting apparatus 1020 will be explained briefly.

In order to take out the electronic components 1001, positioned at a suction position by the supplying unit 1002, by the mounting nozzles 1003 provided on the head part 1004, the head part 1004 is positioned by the robot 1009, and the mounting nozzles 1003 on the head part 1004 hold the electronic components 1001. Since the plurality of mounting nozzles 1003 are provided on the head part 1004 as described above, each mounting nozzle 1003 holds the electronic component 1001.

When the electronic component 1001 is held by each mounting nozzle 1003, each held state of the electronic component 1001 is confirmed in the planar manner, so the head part 1004 is positioned at a recognition position in the recognizing unit 1005 by the robot 1009.

The recognizing unit 1005 recognizes a planar condition of the electronic component 1001 held by each mounting nozzle 1003, and the control unit 1007 performs a positional correction of each component 1001 with respect to a mounting position based on the recognition result.

Next, in order to detect the electronic component 1001 in a height direction, each mounting nozzle 1003 of the head part 1004 is positioned by the robot 1009, and passes between the component height detecting units 1006 arranged opposite each other as shown in FIG. 37 along the detection moving direction α. At this time, each mounting nozzle 1003 passes orthogonal to the parallel luminous flux 1010 for detection emitted by the component height detecting unit 1006 in a state where the electronic components 1001 held are positioned at a detection height (for example, Japanese Unexamined Patent Publication No. 2000-278000). Based on image formed by the electronic component 1001 which is held by each mounting nozzle 1003 and detected by the component height detecting units 1006 when passing therebetween, the control unit 1007 performs a good/bad quality determination of the hold posture of each electronic component 1001. When the heights of a plurality of electronic components 1001 are detected continuously, each electronic component 1001 is determined separately by detecting a gap between adjacent electronic components 1001 held by each mounting nozzle 1003 by the component height detecting units 1006.

If the electronic component 1001 is determined as good in the control unit 1007, the head part 1004 is positioned at an electronic component mounting position on the circuit board 1008 by the operation of the robot 1009. On the other hand, if it is determined as defective, the head part 1004 moves to a disposal position (not shown) of the electronic component 1001, and the defective electronic component 1001 is disposed. In this way, the operation described above is repeated.

However, the conventional electronic component mounting apparatus had the following problems.

That is, when the inspection unit inspects the hold postures of components sucked by the plurality of nozzles provided on the head, pieces of image information of plural components are taken collectively by a single sensor of the inspection unit. At this time, since the hold posture inspection is performed with light beams emitted from lighting units provided in the outer periphery of the viewing range of the sensor taking the image information, that is, light beams of the same light amount set in the same manner are irradiated to the plural components at the same timing by the same lighting units, image information about the shapes of components can not be obtained clearly depending on the surface conditions, materials, colors and the like of components. Therefore, there may be a case of a combination of components in which the inspection accuracy in the hold posture inspection is not secured through one scanning operation, or a combination of components in which the hold posture inspection itself is impossible. In such the case, it is required to take in image information again by changing the setting of light beams irradiated from the lighting unit for the posture inspection of components in which inspection accuracy is not obtained or the inspection itself is not possible. Therefore, plural times of scanning operations must be performed, and a time required for the hold posture inspection increases. As a result, there is a case where the productivity in the electronic component mounting apparatus is reduced.

Further, since pieces of hold posture information of components sucked by a plurality of nozzles are taken collectively by the single sensor provided to the inspection unit, a field of view range of the sensor, that is, an angle of field of view, becomes large, whereby the resolution for one pixel of the sensor becomes rough, so a sufficient inspection accuracy cannot be obtained. As a result, there is a case where the productivity in the electronic component mounting apparatus is reduced.

It is therefore a first object of the present invention to provide an electronic component mounting apparatus capable of improving the productivity in the electronic component mounting apparatus.

Further, in the case of detecting the height of the electronic component as described above, the following problem exists. That is, if the mounting nozzles 1003 provided on the head part 1004 are aligned in one row, the operation of component height detection is performed by causing the mounting nozzles 1003 to pass between the component height detecting units 1006 once, along the detection moving direction α. However, in a case where the mounting nozzles 1003 are arranged in plural rows on the head part 1004 as shown in FIG. 38, if the mounting nozzles 1003 are moved in an orthogonal direction with respect to the parallel luminous flux 1010 emitted from the component height detecting unit 1006, images of plural electronic components 1001 are detected at once, so the detecting operation cannot be completed at one time, and the detecting operations must be performed for plural times corresponding to the respective rows.

In recent years, it is required to speed-up a cycle time in an electronic component mounting apparatus. Therefore, the number of mounting nozzles 1003 provided on the head part 1004 tends to increase, and also due to a decrease in the equipment size, an arrangement of the mounting nozzles 1003 in two rows is not unusual. In such a state, performing height detecting operations for the components 1001 for plural times prevents speeding-up of the cycle time.

It is therefore a second object of the present invention to provide a component mounting apparatus and a component mounting method executed in the component mounting apparatus, capable of speeding-up a cycle time.

SUMMARY OF THE INVENTION

In order to achieve the first object, the present invention is configured in the following manner.

According to a first aspect of the present invention, there is provided a component mounting apparatus comprising:
a supplying unit configured to supply a component;
a head configured to have at least two nozzle rows aligned in a Y direction orthogonal to an X direction, each of which comprises at least one nozzle arranged in the X direction and configured to take out the component supplied from the supplying unit and to convey the component;
a circuit board holding unit configured to hold a circuit board on which the component conveyed by the head is mounted; and
an inspection unit, which is disposed on a moving path of the head from the supplying unit to the circuit board holding unit, configured to inspect a hold posture of the component held by the nozzle,
the inspection unit comprising: sensors for posture inspection arranged independently for respective nozzle rows of the nozzles arranged on the head; a lighting unit configured to irradiate light beam to the head at a time of posture inspection; and an entrance port of optical information configured to take an image of the component held by the nozzle.

According to such a configuration, the hold posture inspection of a plurality of components sucked by a plurality of nozzle rows provided on the head is performed with one scanning operation. Thus it is possible to reduce the time required for the hold posture inspection, to improve the accuracy of the hold posture inspection of the components held by the nozzles, and as a result, to improve the productivity of the component mounting apparatus.

According to a second aspect of the present invention, the inspection unit may be configured to have the entrance port and the lighting unit arranged independently for each the sensor. With such a configuration, light beams irradiated from the lighting unit can be set independently for each of the components sucked by the respective nozzle rows provided on the head, whereby the hold posture inspection of a plurality of components sucked by the respective nozzle rows can be performed with a single scanning operation, so it is possible to reduce the time required for the posture inspection, and as a result, to improve the productivity of the component mounting apparatus.

According to a third aspect of the present invention, centers of fields of view of the respective sensors of the inspection unit may be aligned in the X direction without displacement. With such a configuration, pieces of image information of the components sucked by a plurality of nozzle rows provided on the head can be taken at the same timing. So it is possible to reduce the time required for the hold posture inspection of the components sucked by the nozzles, and as a result, to improve the productivity of the component mounting apparatus. Further, the space occupied by the inspection unit in the X direction can be small and compact, whereby it is possible to constitute a compact component mounting apparatus.

According to a fourth aspect of the present invention, centers of fields of view of the respective sensors of the inspection unit may be arranged to be shifted in the X direction.

when the intervals between a plurality of nozzle rows provided on the head are narrow, if the fields of view of the respective sensors of the inspection unit are aligned in the X direction, a sufficient setting space for the lighting unit cannot be obtained. So, there is a case that the light amount of the light beams irradiated from the lighting unit is insufficient, whereby it is impossible to secure the accuracy of the posture inspection of the components held by the nozzles.

With the configuration of the fourth aspect, even in the case, by arranging the fields of view of the respective sensors to be shifted in the X direction, it is possible to secure a setting space for the lighting unit emitting the light amount of light beams sufficient for securing the accuracy of the posture inspection of the components held by the nozzles, and as a result, to improve the productivity of the component mounting apparatus.

According to a fifth aspect of the present invention, in a case that the nozzles provided on the head are arranged in three rows or more in the Y direction, centers of fields of view of the respective sensors of the inspection unit may be arranged to be shifted in zigzag in the X direction. With such a configuration, the space in the X direction becomes smaller comparing with the case where the centers of the fields of view of the respective sensors are shifted in sequence in the X direction. Thus, it is possible to reduce the time required for taking in image information of the hold postures of the components sucked by a plurality of nozzle rows provided on the head. As a result, it is possible to improve the productivity of the component mounting apparatus and make the inspection unit compact, and thus a compact component mounting apparatus can be configured.

According to a sixth aspect of the present invention, the inspection unit may be configured to have a common entrance port and a common lighting unit with respect to all sensors of the inspection unit, and centers of fields of view of the respective sensors may be arranged to be shifted in the X direction. With such a configuration, it is possible to secure a setting space for the lighting unit irrespective of a plurality of nozzle rows provided on the head by providing the common entrance port and common lighting unit with respect to all sensors of the inspection unit. Thus it is possible to easily configure the lighting unit for obtaining the light amount of light beams required for obtaining the inspection accuracy of the hold posture inspection of the components sucked by the nozzles, and to improve the accuracy of the hold posture inspection of the components held by the nozzles, and further to set the light amount of light beams emitted from the lighting unit for each sensor, that is, for each of the components sucked by the respective nozzle rows provided on the head, by arranging the centers of the fields of view of the respective sensors to be shifted in the X direction. This enables to perform the hold posture inspection of a plurality of components sucked by the respective nozzle rows with one scanning operation. Therefore, it is possible to reduce the time required for the posture inspection, and as a result, to improve the productivity of the component mounting apparatus.

According to a seventh aspect of the present invention, the inspection unit may be configured to have a reflectance including a mirror between the entrance port and the sensors, and the sensors are arranged on a side face of the inspection unit. With such a configuration in which optical information of the components, sucked by the nozzles, come through the entrance port is reflected in a direction toward the sensors disposed on the side face of the inspection unit with the reflectance, height dimension of the inspection unit can be lowered. Thus the rigidity of the inspection unit increases and the accuracy of the hold posture inspection of the components sucked by the nozzles can be improved. As a result, it is possible to improve the productivity of the component mounting apparatus. Further, by disposing the sensors on the side face of the inspection unit, maintenances such as adjustment and replacement becomes easily.

According to an eighth aspect of the present invention, the inspection unit may be configured to have a reflecting/transmitting member comprising a half mirror or a prism between the entrance port and the sensors, and the sensors of the inspection unit may be disposed alternately on a reflected light side and a transmitted light side of the reflecting/transmitting member with respect to optical information, of the component sucked by the nozzle, come through the entrance port.

When the sensors are aligned on the same face such as a lower face or a side face of the inspection unit, there is a case that the interval between the nozzle rows arranged on the head becomes larger than necessary due to an influence of the outside dimension of the sensors.

With configuration of the eighth aspect, even in the case, by arranging the reflecting/transmitting member between the entrance port and the sensors and alternately arranging the sensors of the inspection unit on the reflected light side and the transmitted light side of the reflecting/transmitting member, it is possible to reduce the interval between the nozzle rows arranged on the head. So, the head can be made compact. As a result, it is possible to reduce the space of the inspection unit occupying in the Y direction, whereby the inspection unit becomes compact.

According to a ninth aspect of the present invention, lenses may be provided between the reflecting/transmitting member and the sensors of the inspection unit.

There is a case that the interval between the sensors is narrow because the interval between a plurality of nozzle rows provided on the head is narrow, when the respective sensors of the inspection unit are arranged on the same face such as a lower face of a side face of the inspection unit. So, diameter of the lenses having the brightness sufficient for the sensors cannot be secured and then the brightness of the light information taken into the sensors is insufficient, whereby the accuracy of the hold posture inspection of the components sucked by the nozzles cannot be secured.

With the configuration of the ninth aspect, even in the case, by providing the reflecting/transmitting member between the entrance port and the sensors and arranging the sensors of the inspection unit alternately on the reflected light side and the transmitted light side in the reflecting/transmitting member, and arranging lenses between the reflecting/transmitting member and the respective sensors, the diameter of lenses can be larger. Therefore, it is possible to improve the accuracy of the hold posture inspection of the components sucked by the nozzles provided on the head, and as a result, to improve the productivity of the component mounting apparatus.

According to a tenth aspect of the present invention, a reflecting/transmitting member including a half mirror or a prism may be provided between the entrance port and the sensors, and another sensor may be additionally disposed at any position corresponding to a transmitted light side of the reflecting/transmitting member where an image is capable to be taken. With such a configuration, it is possible to improve the accuracy of the hold posture inspection by taking in image information of a component with a sensor optimum for the hold posture inspection of the component sucked by each nozzle among a plurality of sensors of the inspection unit. Further, since the number of the sensors is increased, the accuracy of the posture inspection of the components sucked by the nozzles can be improved, and also the inspection object components are expanded. As a result, it is possible to improve the productivity of the component mounting apparatus.

According to an eleventh aspect of the present invention, the sensors of the inspection unit may include sensors of different ranges of vision. With such a configuration, it is possible to improve the accuracy of the hold posture inspection by taking in image information of a component with a sensor having the optimum range of vision for the hold posture inspection of the component sucked by each nozzle among a plurality of sensors of the inspection unit. Further, since the sensors of different ranges of vision are included, the accuracy of the posture inspection of the components sucked by the nozzles can be improved, and also the inspection object components are expanded. As a result, it is possible to improve the productivity of the component mounting apparatus.

According to a twelfth aspect of the present invention, the sensors of the inspection unit may include sensors of different resolutions. With such a configuration, it is possible to improve the accuracy of the hold posture inspection by taking in image information of a component with a sensor having the optimum resolution for the hold posture inspection of the component sucked by each nozzle among a plurality of sensors of the inspection unit. Further, since the sensors of different resolutions are included, the accuracy of the posture inspection of the components sucked by the nozzles can be improved, and also the inspection object components are expanded. As a result, it is possible to improve the productivity of the component mounting apparatus.

In order to achieve the second object, the present invention is configured as follows.

That is, a component mounting apparatus of a thirteenth aspect of the preset invention is a component mounting apparatus in which electronic components are held from an electronic component supplying device and mounted on a circuit board, comprising:

a component holding head configured to arrange component holding members for holding the electronic components in a plurality of lines and in a plurality of rows and move in X and Y directions orthogonal to each other; and a component height detecting device configured to detect heights of the electronic components held by the component holding members in order to detect quality of hold postures of the electronic components held by the component holding members, the component height detecting device having a pair of light emitting unit and light receiving unit configured to emit and receive light for detection at a detectable angle (θ) with respect to an orthogonal direction orthogonal to a moving direction of the component holding members moved by the component holding head, the detectable angle being an angle for detecting individually each of the electronic components held by each of the component holding members.

Further, assuming that an arranging interval between the component holding members in the moving direction is P1 and an arranging interval between the component holding members in the orthogonal direction is P2, the detectable angle may be an angle obtained from $\tan^{-1}((P1/2)/P2)$.

Further, it may further comprise a control device configured to determine the quality of the electronic component based on component height information in a detecting section including a center of the component holding member in the moving direction among pieces of component height information sent from the component height detecting device.

A component mounting method according to a fourteenth aspect of the present invention is a method for holding electronic components and mounting them on a circuit board, comprising:

after holding the electronic components with component holding members arranged in a plurality of lines and a plurality of rows, and before mounting the electronic components on the circuit board, projecting light for detection at a detectable angle (θ) for detecting individually each of the electronic components held by the component holding members with respect to an orthogonal direction orthogonal to a moving direction of the component holding members and receiving the light for detection, and inspecting quality of hold postures of the electronic components held by the component holding members.

According to the component mounting apparatus of the thirteenth aspect and the component mounting method of the fourteenth aspect, the component height detecting device is provided, and the light for detection is projected at the detectable angle detecting each electronic component held by each component holding member, and the light for detection is received, whereby the quality of the electronic components held by the component holding members is inspected. Therefore, even in the case where the component holding members are arranged in a plurality of lines and a plurality of rows, it is possible to obtain image information for all electronic components with a single scanning without increasing the number of detections. Therefore, it is possible to speed-up the cycle time relating to the component mounting, comparing with the conventional case.

Further, since the control device is provided and the quality of the component holding postures are determined based on the component height information in the detecting section including the center of the component holding member, even if images are overlapped for adjacent electronic components, it is possible to determine which electronic component height information of the electronic component is obtained. As s result, it is possible to speed-up a cycle time relating to component mounting, comparing with the conventional case.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
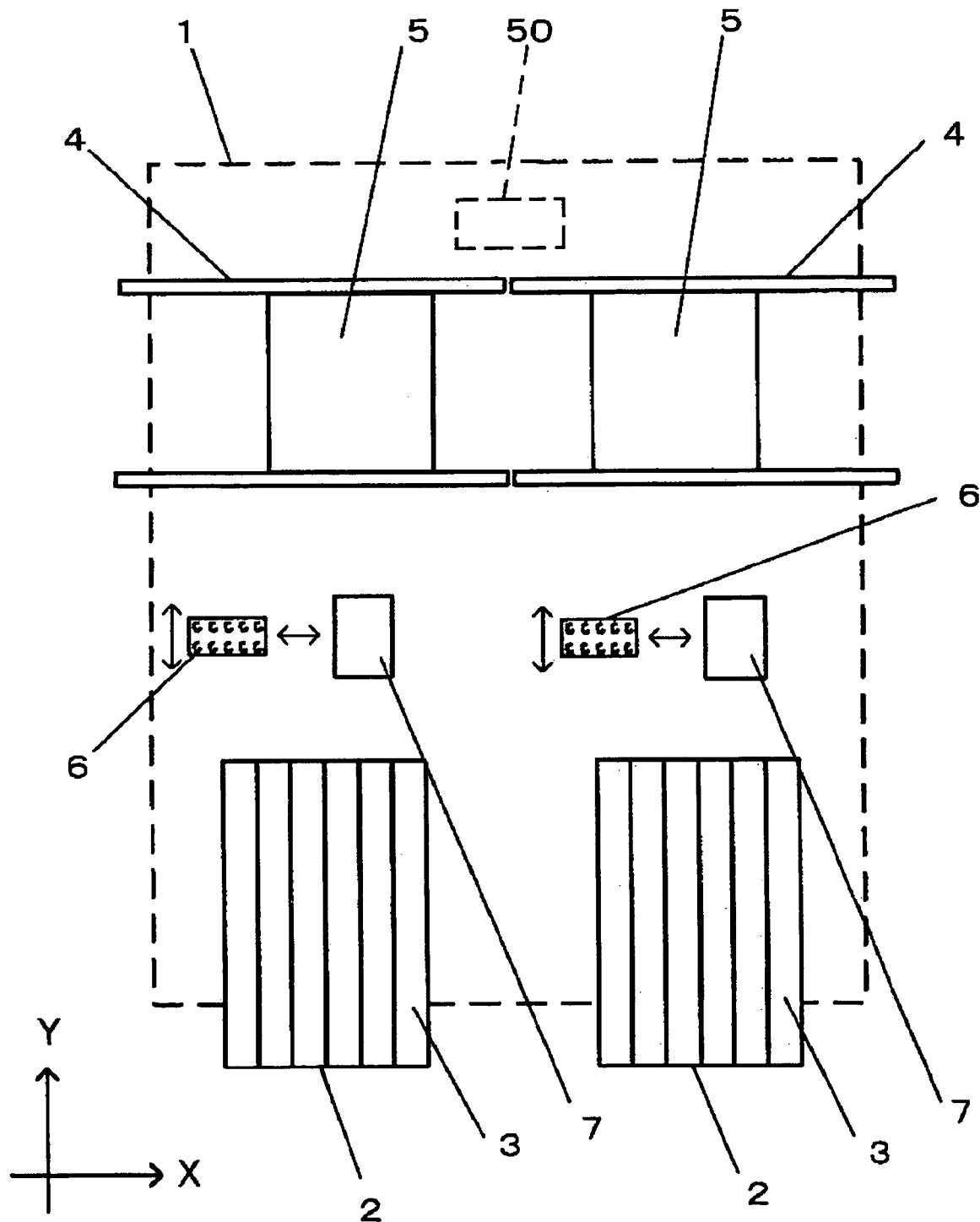
FIG. 1 is a schematic plan view showing a component mounting apparatus of a first embodiment of the present invention.

Before the description of the present invention proceeds, it is to be noted that like parts are designated by like reference numerals throughout the accompanying drawings.

Hereinafter, each embodiment of the present invention will be explained in detail with reference to the drawings.

First Embodiment

Hereinafter, a first embodiment of the present invention will be explained using FIGS. 1 to 6.

Figure 2:
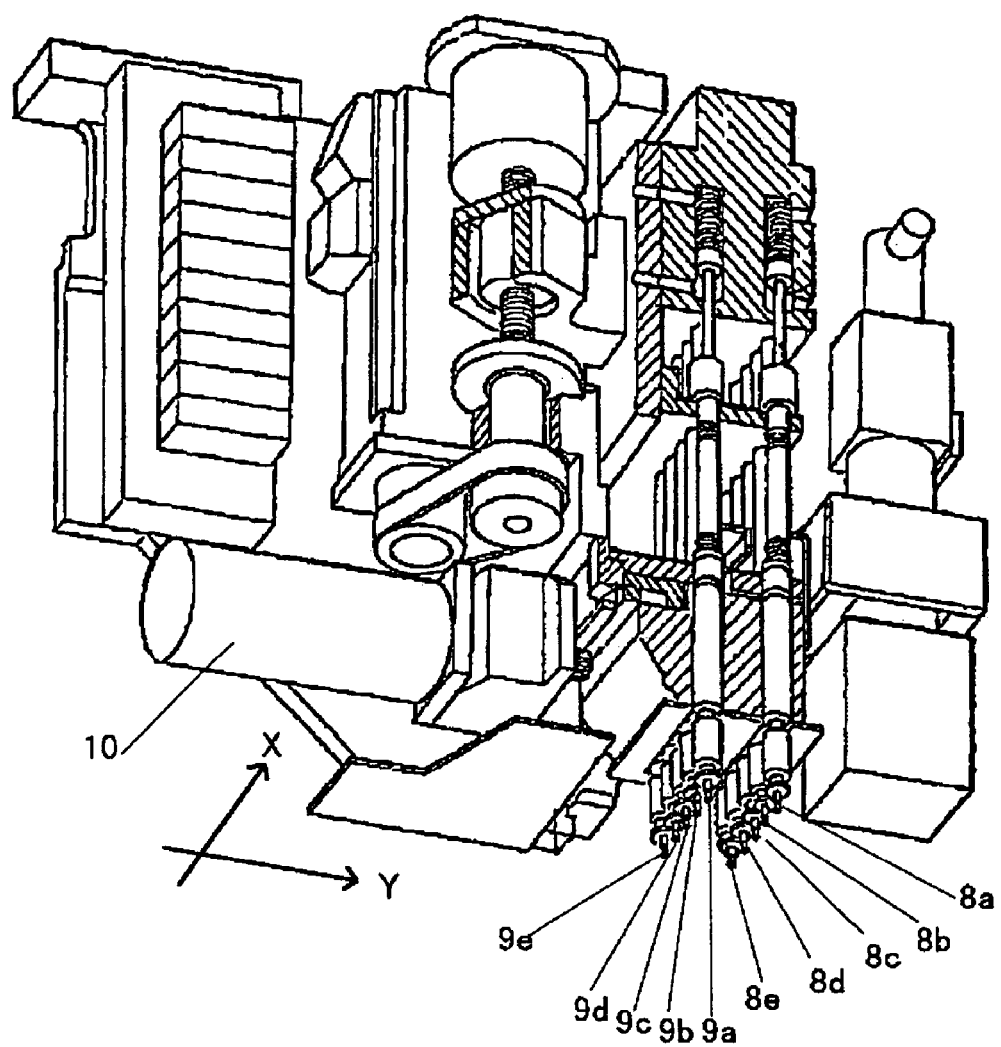
FIG. 2 is a perspective view showing a head of the first embodiment.

FIG. 1 is a schematic plan view showing a component mounting apparatus of the first embodiment in the present invention; FIG. 2 is a perspective view showing a head of the electronic component mounting apparatus; and FIGS. 3 to 6 are: a plan view showing an inspection unit of the electronic component mounting apparatus, a timing chart of taking image information (hereinafter referred to as "image pickup" or "imaging") of components sucked by nozzles in the inspection unit, a sectional view of the inspection unit, and a side view of the inspection unit.

As shown in FIG. 1, a supplying unit 2 has a plurality of supplying parts for supplying components (not shown in FIG. 1), and components supplied by the supplying unit 2 are sucked and held by a plurality of nozzles (described later) provided on a head 6 movable in X and Y directions, and are mounted on a circuit board 5 held by a circuit board holing unit 4. The circuit board holding unit 4 serves not only to hold the circuit board 5 but also to convey the circuit board 5 in an X direction and position it.

On the head 6, there are provided ten nozzles in total arranged in two nozzle rows in a Y direction each of which consists of five nozzles aligned in an X direction, as nozzles 8a to 8e of a first nozzle row and nozzles 9a to 9e of a second nozzle row, as shown in FIG. 2. Arranging intervals between five nozzles of each of the first nozzle row of the nozzles 8a to 8e and the second nozzle row of the nozzles 9a to 9e are set corresponding to the arranging intervals of the supplying parts 3 of the supplying unit 2 so as to enable a plurality of components to be sucked at once. Further, the interval between the two nozzle rows, that is, the first nozzle row of the nozzles 8a to 8e and the second nozzle row of the nozzles 9a to 9e, is set to have an interval more than a distance that the sucked components are not in contact or interfered with each other, considering the outer dimensions of the components to be sucked by the nozzles of the respective nozzle rows. The reference numeral 10 indicates a motor for correcting rotational positions, about the center axes, of the nozzles 8a to 8e of the first nozzle row and the nozzles 9a to 9e of the second nozzle row. By driving the motor 10, the rotational position of each of the nozzles 8a to 8e of the first nozzle row and the nozzles 9a to 9e of the second nozzle row is adjustable.

Inspection units 7 are arranged between the supplying unit 2 and the circuit holding unit 4, and with each of the inspection units 7, a hold posture inspection for components sucked by the nozzles 8a to 8e of the first nozzle row and the nozzles 9a to 9e of the second nozzle row arranged on the head 6 is performed.

The electronic component mounting apparatus 1 has a control unit 50 for controlling the operation of each unit. The control unit 50 stores mounting position information such as types, mounting positions and angles of components to be mounted on the circuit board 5. The inspection unit 7 inspects the hold postures of the components held by the nozzles 8a to 8e of the first nozzle row and the nozzles 9a to 9e of the second nozzle row arranged on the head 6, from the image information of the components imaged. If the hold postures of the components are shifted from predetermined correct ones, the control unit 50 computes the XY-moving amounts of the head 6 and the rotational angle by the motor 10 of the head 6, that is, rotational angles of the nozzles 8a to 8e of the first nozzle row and the nozzles 9a to 9e of the second nozzle row, to correct the shifts. Further the control unit 50 controls the operation of each unit as well as the computation for correction and performs mounting of the components on the circuit board 5.

The electronic component mounting apparatus 1 of the present embodiment has a symmetrical two-stage configuration as shown in FIG. 1 so as to improve the productivity, in which each stage is capable of mounting operation independently.

Next, a detailed explanation will be given for a hold posture inspection, in the inspection unit 7, of the components sucked by the nozzles 8a to 8e of the first nozzle row and the nozzles 9a to 9e of the second nozzle row arranged on the head 6.

Figure 3:
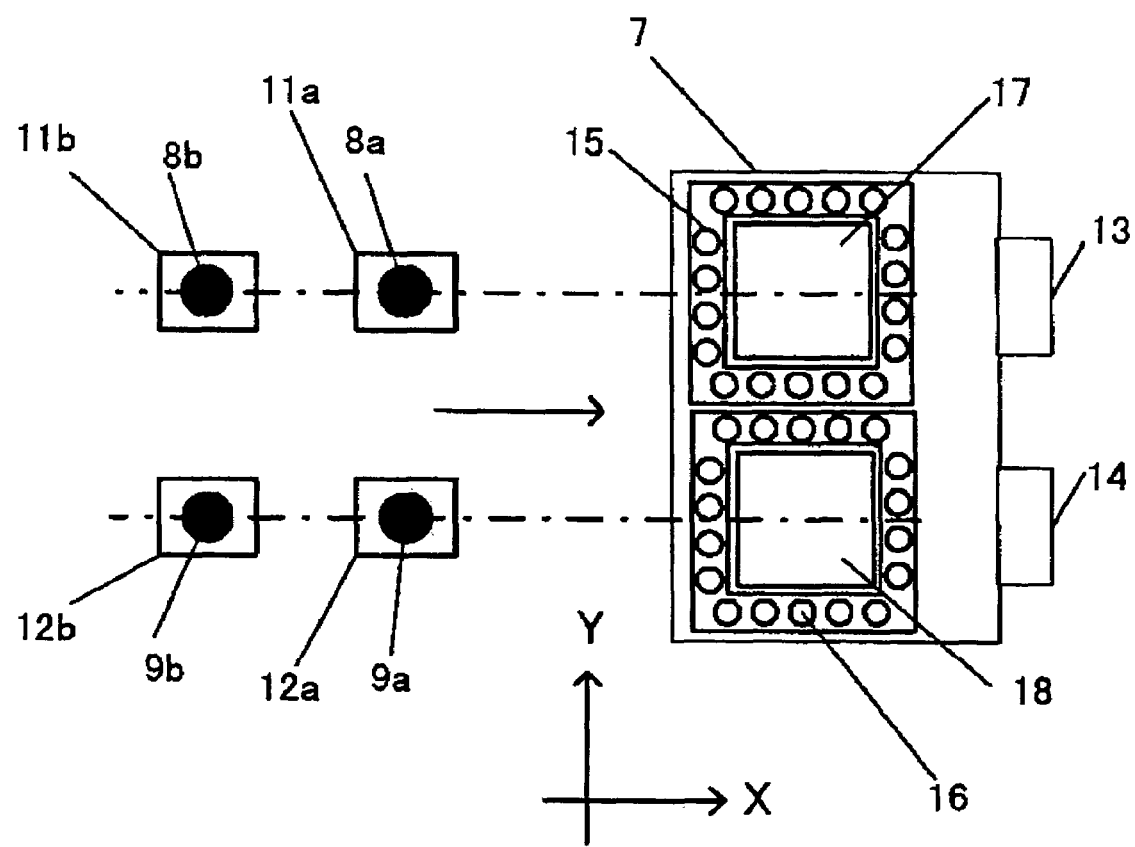
FIG. 3 is a plan view showing an inspection unit of the first embodiment.
Figure 4:
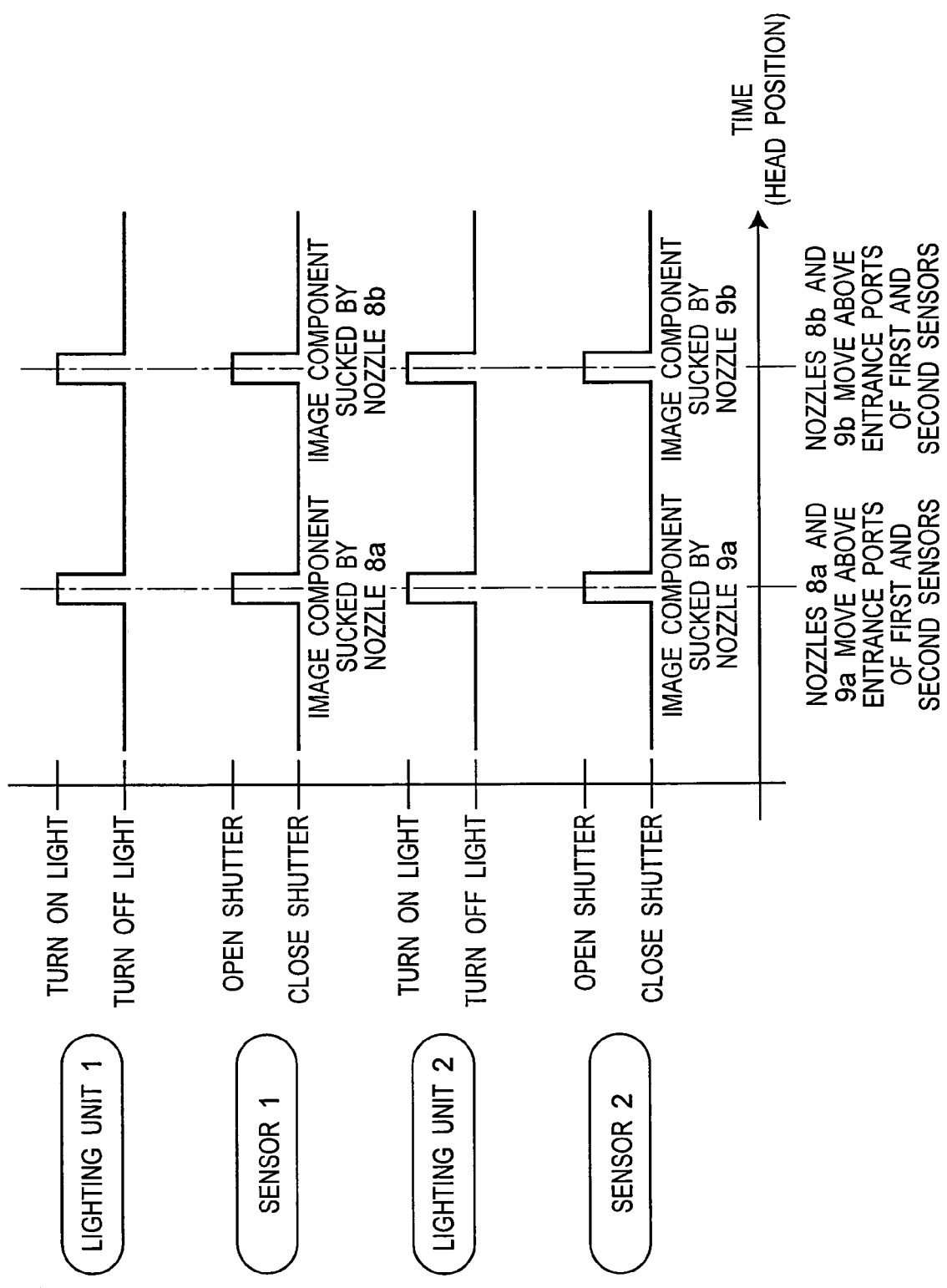
FIG. 4 is a timing chart of sensor imaging in the inspection unit of the first embodiment.

In FIG. 3, the reference numerals 11a and 11b are first components sucked and held by the nozzles 8a and 8b of the first nozzle row arranged on the head 6 (not shown in FIG. 3), and 12a and 12b are second components sucked and held by the nozzles 9a and 9b of the second nozzle row. Note that the third nozzles or after, that is, nozzles 8c, 8d, 8e, 9c, 9d and 9e and components sucked by these nozzles are omitted and not shown in FIG. 3, and are also omitted in the explanation below. The reference numeral 13 indicates a first sensor for performing pickup images of the hold postures of the first components 11a and 11b sucked and held by the nozzles 8a and 8b of the first nozzle row, and the reference numeral 15 indicates a first lighting unit for emitting a light beam to the first components 11a and 11b when performing pickup images, and the reference numeral 17 indicates a first entrance port for taking in light information when performing pickup images. Similarly, the reference numeral 14 indicates a second sensor for performing pickup images of the second components 12a and 12b sucked and held by the nozzles 9a and 9b of the second nozzle row, the reference numeral 16 indicates a second lighting unit for emitting a light beam to the second components 12a and 12b when performing pickup images, and the reference numeral 18 indicates a second entrance port for taking in light information when performing pickup images. The first and second lighting units 15 and 16 are arranged along the outer periphery of the first and second entrance ports 17 and 18, respectively. Here, an interval between the center of a field of view of the first sensor 13 and the center of a field of view of the second sensor 14 is arranged so as to coincide with an interval between the nozzle rows arranged on the head 6, that is, an interval between the center of the nozzle 8a of the first nozzle row and the center of the nozzle 9a of the second nozzle row. Further, the center of the first entrance port 17, the center of the first lighting unit 15, and the center of the field of view of the first sensor 13 are arranged so as to coincide with each other. Similarly, the center of the second entrance port 18, the center of the second lighting unit 16, and the center of the field of view of the second sensor 14 are also arranged so as to coincide with each other. The center of the first entrance port 17 and the center of the second entrance port 18 are arranged not to be shifted in an X direction but aligned, and lines connecting the centers of the respective nozzles arranged along a Y direction about the nozzles 8a and 8b of the first nozzle row and the nozzles 9a and 9b of the second nozzle row of the head 6, that is, a line connecting the center of the nozzle 8a of the first nozzle row and the center of the nozzle 9a of the second nozzle row, and a line connecting the center of the first entrance port 17 and the center of the second entrance port 18 are arranged to be in parallel.

When performing a hold posture inspection of the first components 11a and 11b and the second components 12a and 12b sucked by the nozzles 8a and 8b of the first nozzle row and the nozzles 9a and 9b of the second nozzle row arranged on the head 6, first the head 6 is moved in the Y direction such that a Y directional position of each of the first nozzle row of the nozzles 8a and 8b and the second nozzle row of the nozzles 9a and 9b arranged on the head 6, and a Y directional position of each center of the fields of view of the first and second sensors 13 and 14 coincide with each other (FIG. 3 shows a state where movement in the Y direction has been completed). After the movement, the head 6 is moved in the X direction so as to pass above the inspection unit 7. And then the first and second components 8a, 8b, 9a, and 9b are imaged by the first and second sensors 13 and 14, respectively. Performing pickup images of the first and second components 8a, 8b, 9a and 9b is performed without causing the head 6 to stop temporarily above the first and second entrance ports 17 and 18 of the inspection unit 7 by using a shutter function of area sensors if the first and second sensors 13 and 14 are area sensors. Specifically, as shown in the timing chart of FIG. 4, at the timing when the head 6 moves above the inspection unit 7 in the X direction and the nozzle 8a of the first nozzle row and the nozzle 9a of the second nozzle row pass the centers of the first and second entrance ports 17 and 18, that is, the centers of the fields of view of the first and second sensors 13 and 14, respectively, the shutters of the first and second sensors 13 and 14 are opened so as to perform exposure. Then performing pickup image of the first component 11a sucked by the nozzle 8a of the first nozzle row by the first sensor 13 and performing pickup image of the second component 12a of the nozzle 9a of the second nozzle row by the second sensor 14 are performed simultaneously. Further, the head 6 is kept moving in the X direction, and at an instance when the nozzle 8b of the first nozzle row and the nozzle 9b of the second nozzle row pass through the centers of the fields of view of the first and second sensors 13 and 14 respectively, the shutters of the first and second sensors 13 and 14 are opened so as to perform exposures. Then, performing pickup image of the first component 11b sucked by the nozzle 8b of the nozzle row by the first sensor 13 and performing pickup image of the second component 12b sucked by the nozzle 9b of the second nozzle row by the second sensor 14 are performed simultaneously. Hereinafter, pickup images of all components sucked by the ten nozzles arranged on the head 6 are performed similarly, although not shown. Note that at an instance of performing pickup image by using the shutter function of the first and second sensors 13 and 14, irradiation of the light beam set for each component is performed by the first and second lighting units 15 and 16 to the components imaged by control of the control unit 50. In a case where line sensors are used for the first and second sensors 13 and 14, the sequence of performing pickup image is similar to that of the case of using the area sensors as mentioned above, except that the first and the second sensors 13 and 14 keep taking image information during a period when the imaging object components pass through the fields of view of the first and second sensors 13 and 14, not using the shutter function of the sensors, and that the first and second lighting units 15 and 16 keep irradiating the light beams during the period when the imaging object components pass through the fields of view of the first and second sensors 13 and 14, that is, during the period when the first and second sensors 13 and 14 keep taking the image information.

With such the above configuration, it is possible to set light beams irradiated from the first and second lighting units 17 and 18 independently, with respect to the first component 11a and the second component 12a and the first component 11b and the second component 12b passing in the line along the Y direction above the inspection unit 7. Therefore, even in a case of a combination where the first component 11a and the second component 12a and the first component 11b and the second component 12b are viewed differently with the same light beam setting, so that the accuracy of the posture inspection is insufficient or there is a component that the posture inspection itself is impossible, it is possible to perform pickup image and posture inspection of all components only with the head 6 moving in the X direction and passing above the inspection unit 7 once, that is, with one scanning operation. Further, since the first and second sensors 13 and 14 are arranged such that the centers of the fields of view thereof are not shifted in the X direction but are aligned, performing pickup images of two components becomes possible at the same timing. Therefore, the time required for performing pickup images of all components are reduced, and consequently, the time required for the hold posture inspection is reduced.

Further, since imaging is performed for each row of the first nozzle row of the nozzles 8a and 8b and the second nozzle row of the nozzles 9a and 9b, that is, for each component of the first components 11a and 11b and the second components 12a and 12b, by using the first and second sensors 13 and 14, respectively, it is possible to improve accuracy of the hold posture inspection without causing the resolution per one pixel of the sensor to be rough, comparing with a case that the field of view is enlarged by one sensor so as to image a plurality of components as the conventional art.

Figure 5:
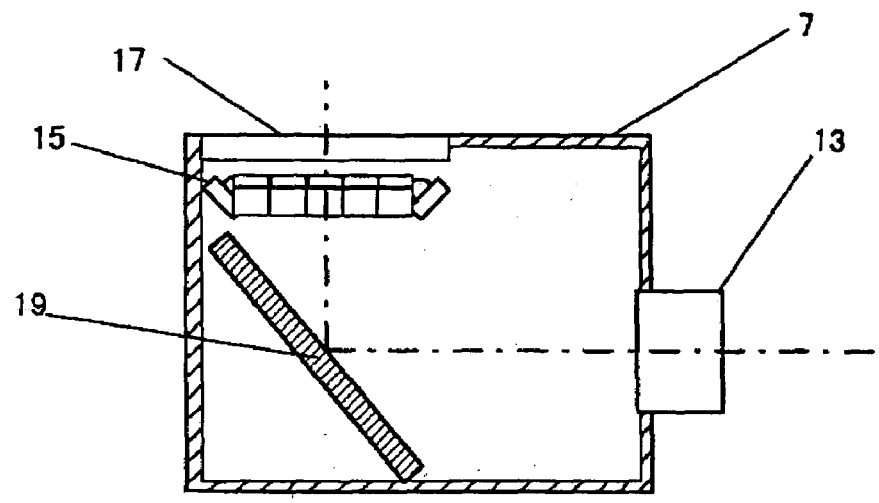
FIG. 5 is a sectional view showing the inspection unit of the first embodiment.
Figure 6:
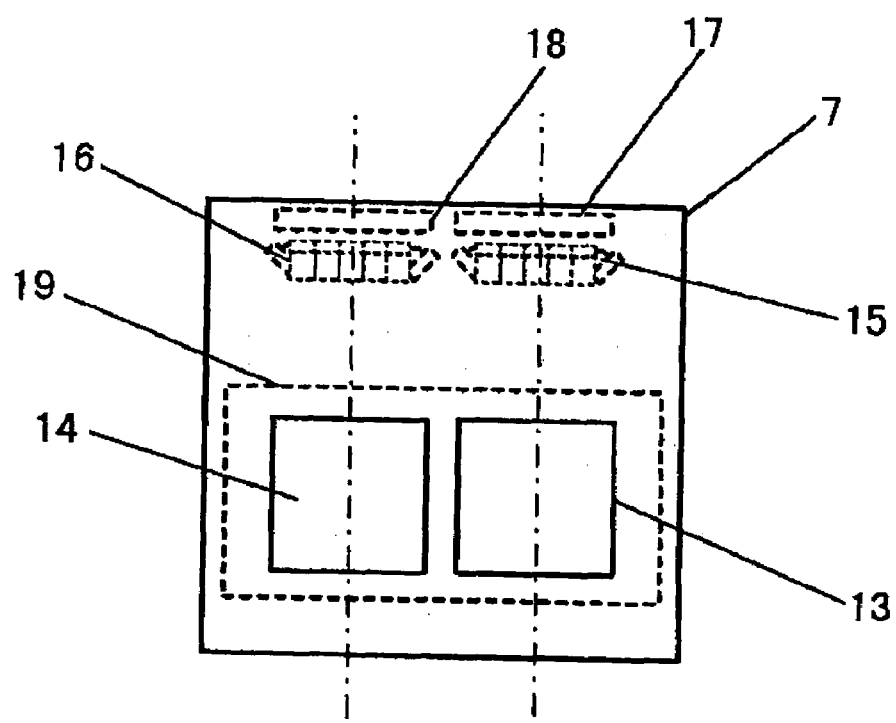
FIG. 6 is a side view showing the inspection unit of the first embodiment.

Further, in FIGS. 5 and 6, the reference numeral 19 indicates a reflector such as a mirror which reflects light information of the images of the first and second components 11a, 11b, 12a and 12b made incident from the first and second entrance ports 17 and 18 provided on the upper part of the inspection unit 7. On a side face of the inspection unit 7, the first and second sensors 13 and 14 for imaging are arranged. With such the configuration, the height dimension of the inspection unit 7 becomes smaller comparing with a case where the first and second sensors 13 and 14 are disposed on a lower face of the inspection unit 7 and receive light information from the first and second entrance ports 17 and 18 directly. Thereby, the rigidity of the inspection unit 7 increases, and the accuracy of the hold posture inspection of the components is improved. Further, by arranging the first and second sensors 13 and 14 on the side face of the inspection unit 7, maintenances such as adjustment and replacement of the first and second sensors 13 and 14 become easier comparing with the case where the first and second sensors 13 and 14 are arranged on the lower face, that is, inside thereof, without using the reflectance 19.

Although not shown, the first sensor 13 and the second sensor 14 do not necessarily have the same range of vision and the same resolution. It is possible to increase kinds of components as the objects of the posture inspection, that is, to expand a range of component handled by the electronic component mounting apparatus 1 by arranging sensors having different features. Thus the productivity can be improved. As specific examples, by setting the range of vision of the first sensor 13 to 8 mm square, components of hold posture inspection objects can be atypical components from a rectangular chip component with the outer dimension of 6 mm wide by 3 mm high to a component of 6 mm square. Also, by setting the range of vision of the second sensor 14 to 6 mm square, components of hold posture inspection objects can be atypical components from a rectangular chip component with the outer dimension of 4 mm wide by 2 mm high to a component of 4 mm square. Further, for both of the first and second sensors 13 and 14, the range of vision is set to 8 mm square and the resolution of the sensor 13 is 300 thousands pixels, and the resolution of the sensor 14 is 800 thousands pixels, whereby the second sensor 14 is capable of coping with smaller components as object components of hold posture inspection than the first sensor 13. However, in a case of a combination where the ranges of vision and the resolutions of the first and the second sensors are different, the first components 11a and 11b and the second components 12a and 12b sucked by the nozzles 8a and 8b of the first nozzle row and the nozzles 9a and 9b of the second nozzle row arranged on the head 6 are limited to the object components of the hold posture inspection of the first sensor 13 and the second sensor 14, respectively, so it is required to contrive the arranging sequence of the supplying parts 3 of the supplying unit 2 or the sequence of sucking components.

Further, although the nozzles provided on the head are arranged in two rows and each row consists of five nozzles in the present embodiment, the present invention is not limited to this configuration. The nozzles may be arranged in three rows or more, and the number of nozzles in one row may be other than five. The number of sensors, lighting units and entrance ports which correspond to the rows of the nozzles may be three or more. This also applies to a second embodiment and after.

Second Embodiment

Next, a second embodiment of the present invention will be explained by using FIGS. 7 and 8.

The second embodiment of the present invention has a similar configuration to that of the first embodiment, except that a reflecting/transmitting member 20 is arranged between the first and second entrance ports 17 and 18 and the first and second sensors 13 and 14 instead of the reflector 19, and additional sensors are arranged on a transmitted light side of the reflecting/transmitting member 20. Therefore, the similar constitutional parts are denoted by the same reference numerals, and detailed explanations thereof are omitted.

Figure 7:
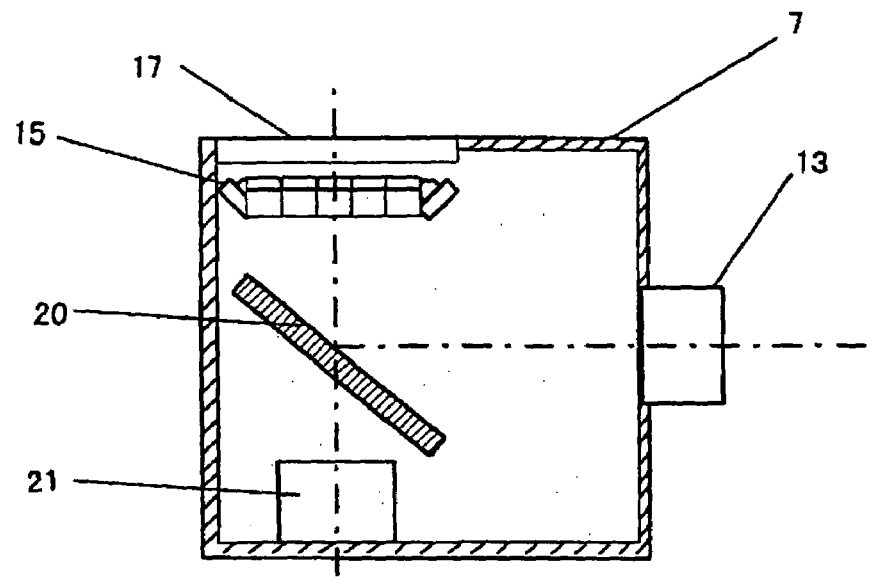
FIG. 7 is a sectional view showing an inspection unit of a second embodiment of the present invention.
Figure 8:
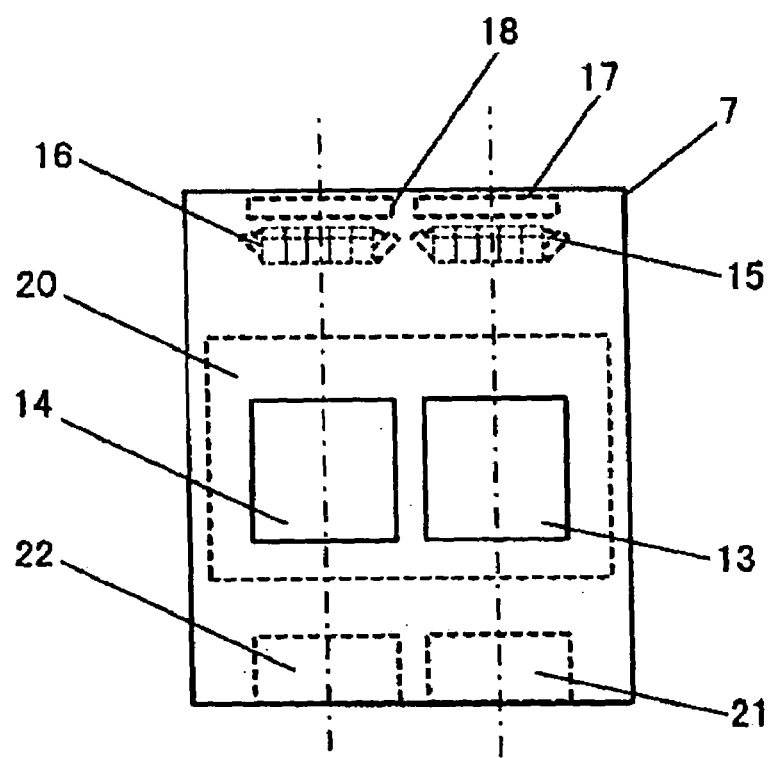
FIG. 8 is a side view showing the inspection unit of the second embodiment.

In FIGS. 7 and 8, the reference numeral 20 indicates the reflecting/transmitting member such as a half mirror or a prism, and the reference numerals 13 and 21 are the first sensor and a first spare sensor provided on a reflected light side of the reflecting/transmitting member 20 and on the transmitted light side of the reflecting/transmitting member 20, respectively, for performing pickup images for the first components 11a and 11b sucked by the nozzles 8a and 8b of the first nozzle row of the head 6. The reference numerals 14 and 22 are the second sensor and a second spare sensor provided on the reflected light side of the reflecting/transmitting member 20 and on the transmitted light side of the reflecting/transmitting member 20, respectively, for performing pickup images for the second components 12a and 12b sucked by the nozzles 9a and 9b of the second nozzle row of the head. Here, the center of the field of view of the first sensor 13 and a center of the field of view of the first spare sensor 21, and the center of the field of view of the second sensor 14 and a center of the field of view of the second spare sensor 22 are arranged so as to coincide with each other, respectively. Further, the first sensor 13 and the first spare sensor 21, and the second sensor 14 and the second spare sensor 22 are different in the resolutions or the ranges of vision, or different in both of the resolutions and ranges of vision.

In this way, with a configuration including two kinds of sensors in which either the resolution or the range of vision or both of them are different for a hold posture inspection of each component of the first components 11a and 11b and the second components 12a and 12b sucked by the nozzles 8a and 8b of the first nozzle row and the nozzles 9a and 9b of the second nozzle row of the head 6, it is possible to improve inspection accuracy of hold postures or to enlarge object components of posture inspection by selectively using two kinds of sensors in accordance with the components to be performed pickup images.

Although the second embodiment of the present invention includes two kinds of sensors in which either the resolution or the range of vision or both of them are different for the hold posture inspection with respect to the first components 11a and 11b and the second components 12a and 12b sucked by the nozzles 8a and 8b of the first nozzle row and the nozzles 9a and 9b of the second nozzle row, it is possible to have a configuration in which only one of the first spare sensor 21 and the second spare sensor 22 is arranged in the inspection unit 7 according to a requirement as the electronic component mounting apparatus 1, and there exist two kinds of sensors that either the resolution or the range of vision or both of them are different for the hold posture inspection with reference to only one of the first components 11a and 11b or the second components 12a and 12b.

Third Embodiment

Next, a third embodiment of the present invention will be explained using FIGS. 9 to 11.

The third embodiment of the present invention has a similar configuration to that of the first embodiment, except that a reflecting/transmitting member 20 is arranged between the entrance ports and the sensors instead of the reflector 19 and the second sensor 14 for performing pickup image for the hold posture inspection of the second components 12a and 12b sucked by the nozzles 9a and 9b of the second nozzle row arranged on the side faces of the inspection unit 7 is arranged on the transmitted light side of the reflecting/transmitting member 20, and that lenses for the first and second sensors 13 and 14 are arranged between the reflecting/transmitting member 20 and the first and the second sensors 13 and 14. Therefore, the similar constitutional parts are denoted by the same reference numerals, and detailed explanations thereof are omitted.

Figure 9:
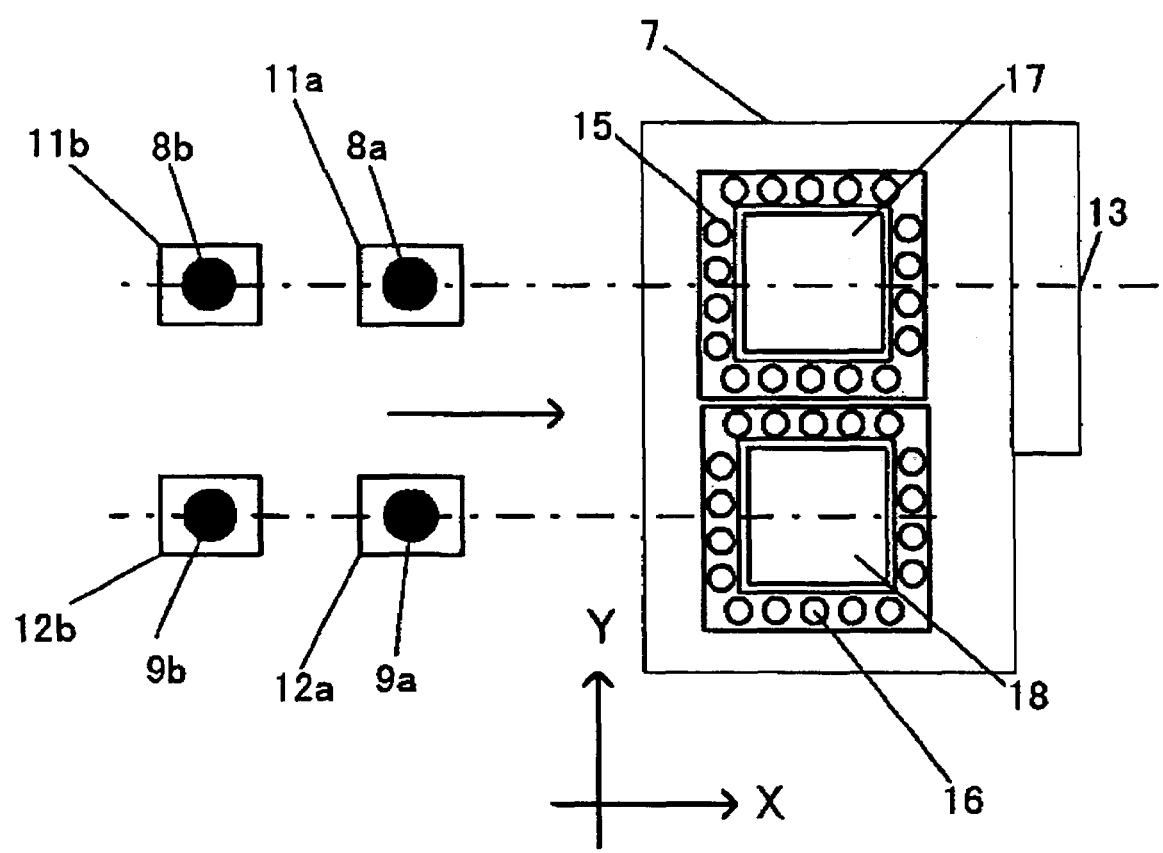
FIG. 9 is a plan view showing an inspection unit of a third embodiment of the present invention.
Figure 10:
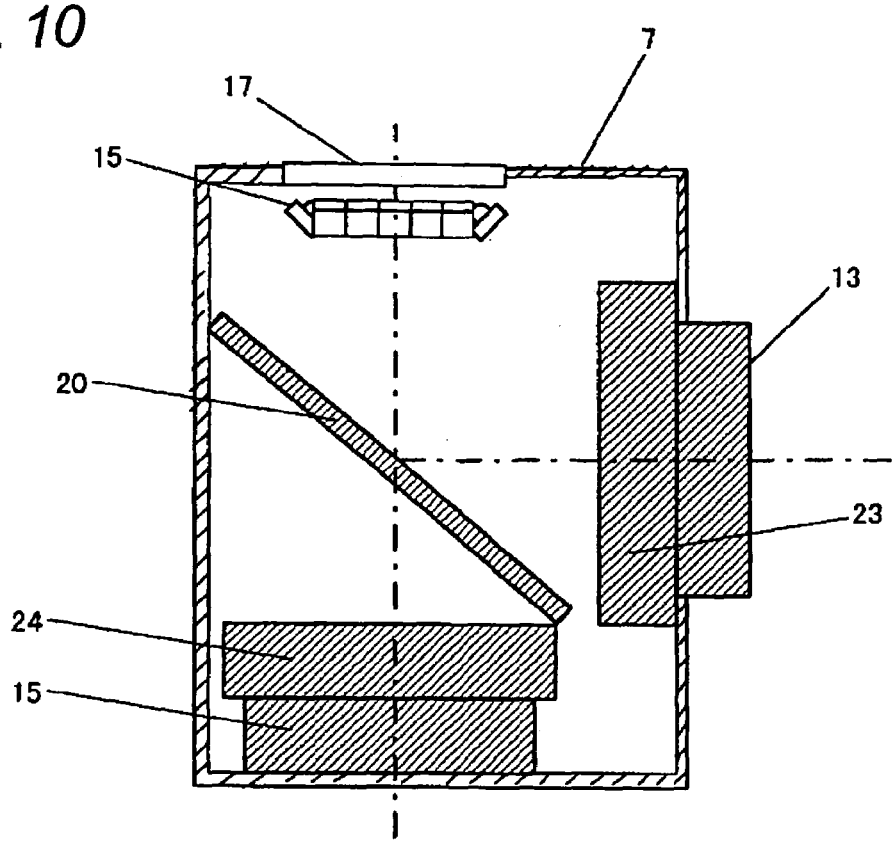
FIG. 10 is a sectional view showing the inspection unit of the third embodiment.
Figure 11:
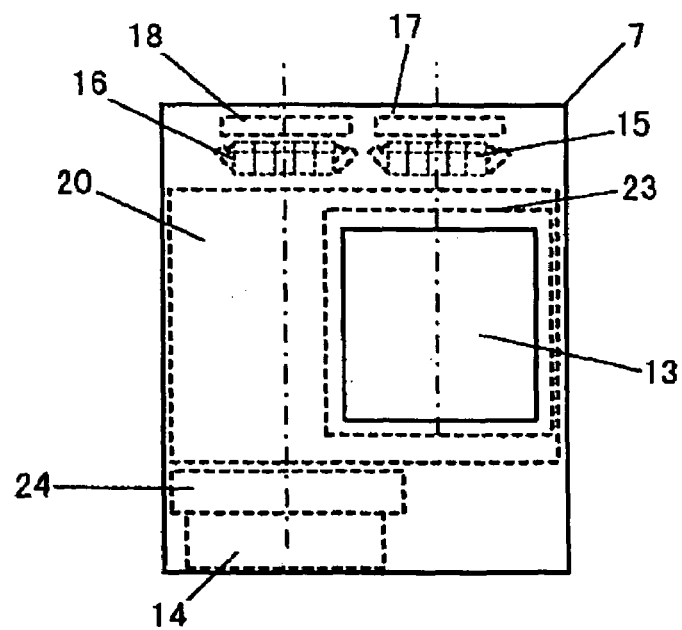
FIG. 11 is a side view showing the inspection unit of the third embodiment.

In FIGS. 9 to 11, the reference numeral 20 indicates the reflecting/transmitting member such as a half mirror provided between the first and second entrance ports 17 and 18 and the first and second sensors 13 and 14, and the reference numeral 23 indicates a first lens for the first sensor 13 for the hold posture inspection of the first components 11a and 11b sucked by the nozzles 8a and 8b of the first nozzle row of the head 6, which is provided between the reflecting/transmitting member 20 and the first sensor 13. The reference numeral 24 indicates a second lens of the second sensor 14 for the hold posture inspection of the second components 12a and 12b sucked by the nozzles 9a and 9b of the second nozzle row, which is provided between the reflecting/transmitting member 20 and the second sensor 14.

With such a configuration, even in a case where the first and second sensors 13 and 14 are aligned on the same face such as a lower face or a side face of the inspection unit 7 and outside dimensions of the first and second sensors 13 and 14 are large so that the interval between the first entrance port 17 and the second entrance port 18 must be wider than necessary, that is, even in a case where the interval between the first nozzle row of the nozzles 8a and 8b and the second nozzle row of the nozzles 9a and 9b becomes wider than necessary, it is possible to reduce the interval between the first nozzle row of the nozzles 8a and 8b and the second nozzle row of the nozzles 9a and 9b arranged on the head 6 so as to make the head 6 compact, by arranging the reflecting/transmitting member 20 between the first entrance port 17 and the second entrance port 18, and the first and second sensors 13 and 14, and by arranging the sensors of the inspection unit 7 alternately on the reflected light side and the transmitted light side of the reflecting/transmitting member 20, that is, by arranging the first sensor 13 on the reflected light side and the second sensor 14 on the transmitted light side. Further, since the interval between the first entrance port 17 and the second entrance port 18 of the inspection unit 7 becomes narrower, the dimension of the inspection unit 7 in the Y direction can be compact.

Further, in a state where the interval between the first nozzle row of the nozzles 8a and 8b and the second nozzle row of the nozzles 9a and 9b provided on the head 6 is narrow and the first and second sensors 13 and 14 are aligned on the same face such as a lower face or a side face of the inspection unit 7, even in a case that a lens diameter with sufficient brightness for the first and second sensors 13 and 14 is not secured, so the brightness of light information taken into the first and second sensors 13 and 14 is insufficient and the accuracy of the hold posture inspection of the first and second components 11a, 11b, 12a and 12b sucked by the nozzles 8a and 8b of the first nozzle row and by the nozzles 9a and 9b of the second nozzle row cannot be secured, it is possible to enlarge the lens diameter by arranging the first and second lens 23 and 24 between the reflecting/transmitting member 20 and the first and second sensors 13 and 14. Thereby, it is possible to improve the accuracy of the hold posture inspection of the first and second components 11a, 11b and 12a, 12b sucked by the nozzles 8a and 8b of the first nozzle row and the nozzles 9a and 9b of the second nozzle row provided on the head 6.

Fourth Embodiment

Next, a fourth embodiment of the present invention will be explained by using FIGS. 12 to 15.

The fourth embodiment of the present invention has a similar configuration to that of the first embodiment, except that one nozzle row consisting of five nozzles aligned in the X direction is added on the head 6, that is, fifteen nozzles in total are arranged in three parallel rows in the Y direction, and a sensor is added in the inspection unit 7 for performing the hold posture inspection of components sucked by the three nozzle rows, that is, three sensors in total are provided, and the centers of the fields of view of the three sensors are arranged in zigzag in the X direction. Therefore, the similar constitutional parts are denoted by the same reference numerals and their detailed explanations are omitted.

Figure 12:
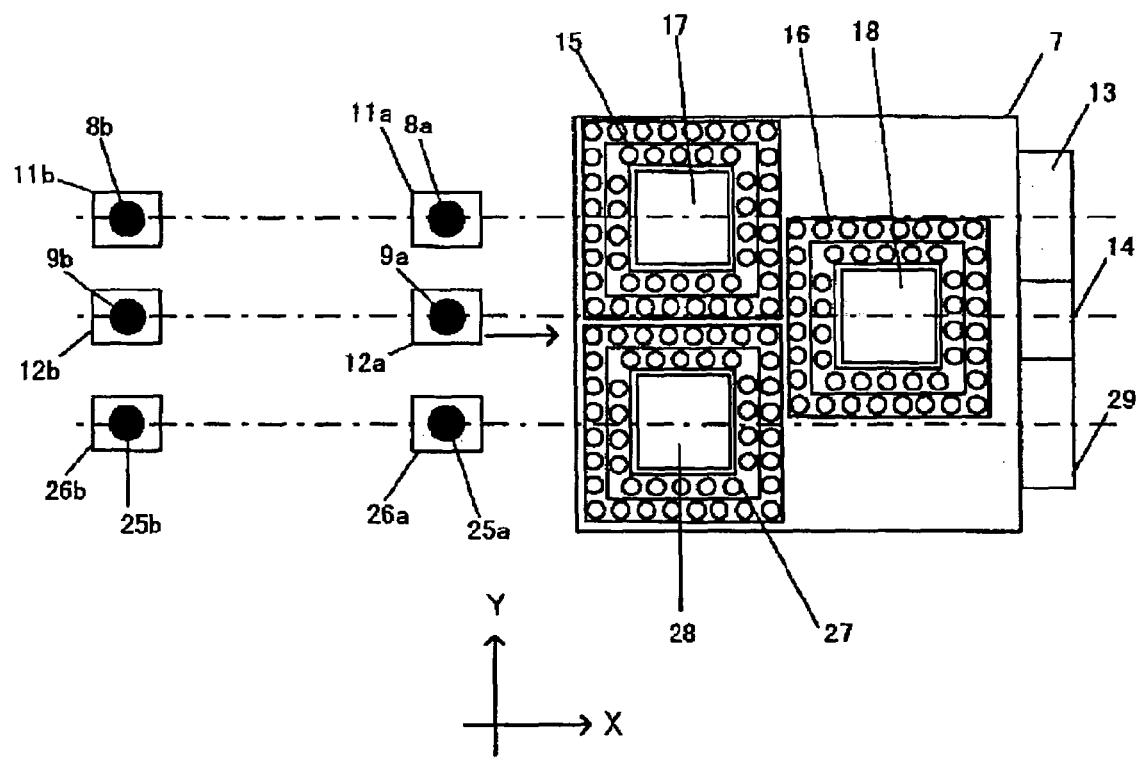
FIG. 12 is a plan view showing an inspection unit of a fourth embodiment of the present invention.
Figure 13:
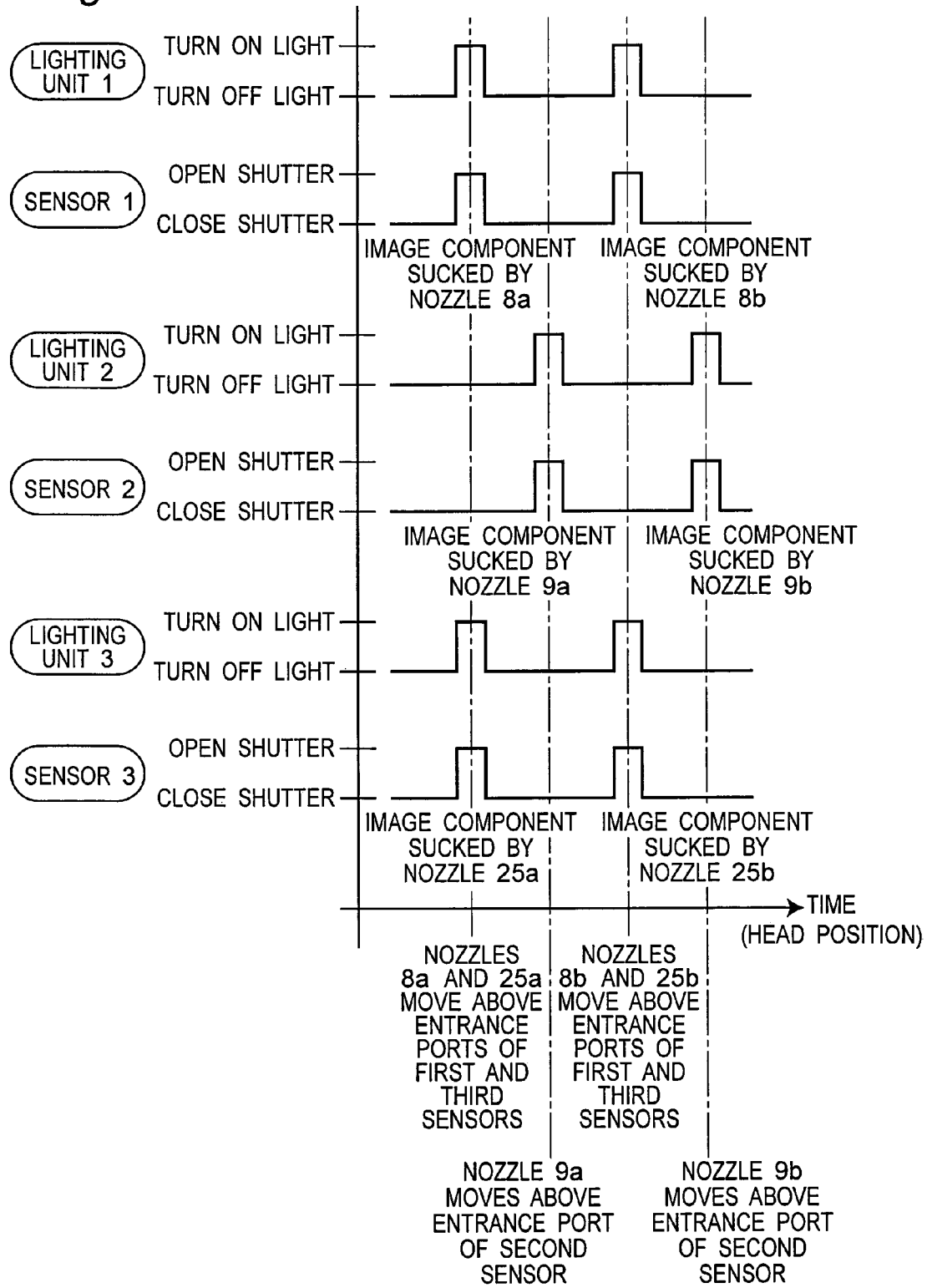
FIG. 13 is a timing chart of sensor imaging in the inspection unit of the fourth embodiment.
Figure 14:
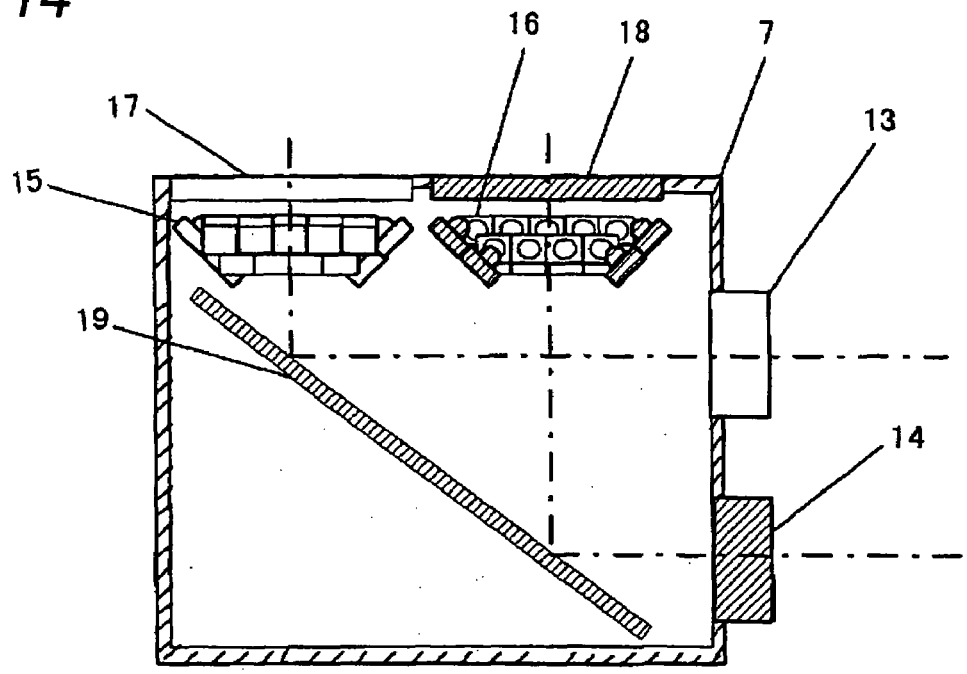
FIG. 14 is a sectional view showing the inspection unit of the fourth embodiment.
Figure 15:
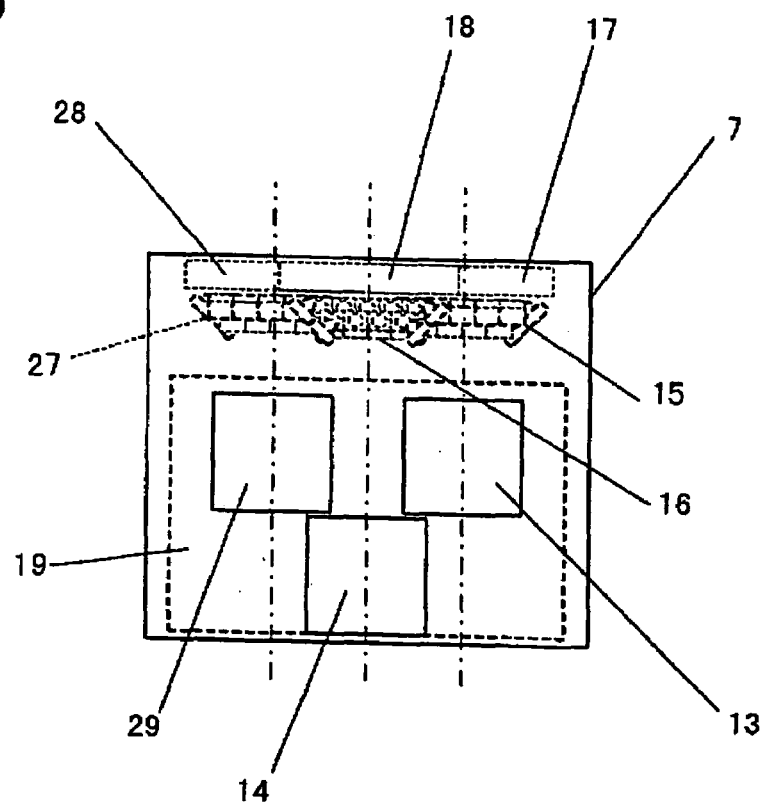
FIG. 15 is a side view showing the inspection unit of the fourth embodiment.

In FIG. 12, the reference numerals 26a and 26b indicate third components sucked and held by nozzles 25a and 25b of a third nozzle row arranged on the head 6. Note that the third to fifth nozzles of the third nozzle row and components sucked by these nozzles are omitted and not shown in FIG. 12, and are also omitted in the following explanation. Further, although not shown, the first to third nozzle rows are aligned in three rows in the Y direction, each of which consists of five nozzles aligned in the X direction, so a configuration of fifteen nozzles in total is provided.

In FIGS. 12 to 15, the reference numeral 29 indicates a third sensor for performing pickup images for the hold posture of the third components 26a and 26b sucked and held by the nozzles 25a and 25b of the third nozzle row, and the reference numeral 27 indicates a third lighting unit for irradiating a light beam to the third components 26a and 26b when imaging, and the reference numeral 28 indicates a third entrance port for taking light information when imaging, and the third lighting units 27 are provided along the outer periphery of the first entrance port 28. The interval in the Y direction between the center of the field of view of the first sensor 13 and the center of the field of view of the second sensor 14, and the interval in the Y direction between the center of the field of view of the second sensor 14 and the center of the field of view of the third sensor 29 are arranged so as to coincide with the interval between the first nozzle row of the nozzles 8a and 8b and the second nozzle row of the nozzles 9a and 9b, and the interval between the second nozzle row of the nozzles 9a and 9b and the third nozzle row of the nozzles 25a and 25b, provided on the head 6 respectively, that is, the interval between the center of the nozzle 8a of the first nozzle row and the center of the nozzle 9a of the second nozzle row, and the interval between the center of the nozzle 9a of the second nozzle row and the center of the nozzle 25a of the third nozzle row. Further, the center of the first entrance port 17, the center of the first lighting unit 15 and the center of the field of view of the first sensor 13 are arranged so as to coincide with one another, and similarly, the center of the second entrance port 18, the center of the second lighting unit 16 and the center of the field of view of the second sensor 14 are arranged so as to coincide with one another, and similarly, the center of the third entrance port 28, the center of the third lighting unit 27 and the center of the field of view of the third sensor 29 are arranged so as to coincide with one another. Further, the center of the first entrance port 17 and the center of the third entrance port 28 are not shifted in the X direction but are aligned, that is, lines connecting the respective nozzle centers corresponding in the Y direction of the nozzles 8a and 8b of the first nozzle row and the nozzles 25a and 25b of the third nozzle row of the head 6, for example, a line connecting the center of the nozzle 8a of the first nozzle row and the center of the nozzle 26a of the third nozzle row, and a line connecting the center of the first entrance port 17 and the center of the third entrance port 28 are arranged so as to be in parallel. Further, the center of the first entrance port 17 and the center of the second entrance port 18 are shifted in the X direction, and the center positions of the first, second and third entrance ports 17, 18 and 28, that is, the respective centers of the fields of view of the first, second and third sensors 13, 14 and 29 are arranged so as to be in zigzag in the X direction.

Next, the hold posture inspection, in the inspection unit, of components sucked by the nozzles arranged on the head 6 will be explained in detail.

When performing the hold posture inspection of the first components 11a and 11b, the second components 12a and 12b, and the third components 26a and 26b sucked by the nozzles 8a and 8b of the first nozzle row, the nozzles 9a and 9b of the second nozzle row, and the nozzles 25a and 25b of the third nozzle row, first the head 6 is moved in the Y direction such that positions in the Y direction of the respective nozzle rows of the first nozzle row of the nozzles 8a and 8b, the second nozzle row of the nozzles 9a and 9b and the third nozzle row of the nozzles 26 and 26b, and the respective centers of the fields of view of the first, second and third sensors 13, 14 and 29 are coincide. Then, as shown by the arrow in FIG. 12, the head is moved in the X direction so as to pass above the inspection unit 7, and by the first second and third sensors 13, 14 and 29, imaging is performed for each of the first, second and third components 11a, 11b, 12a, 12b, 26a and 26b. If the first, second and third sensors 13, 14 and 29 are area sensors, imaging of the first, second and third components 11a, 11b, 12a, 12b, 26a and 26b is performed by not causing the head to stop temporarily above the first, second and third entrance ports 17, 18 and 28 of the inspection unit 7 when the head passes above the inspection unit 7 by using the shutter functions of the first, the second and third sensors 13, 14 and 29. Specifically, as shown in a timing chart of FIG. 13, at an instance when the head moves in the X direction above the inspection unit 7 and the nozzle 8a of the first nozzle row and the nozzle 25a of the third nozzle row pass the centers of the first and third entrance ports 17 and 28, that is, the centers of the fields of view of the first and third sensors 13 and 29, shutters of the first and third sensors 13 and 29 are opened so as to perform exposure, whereby performing pickup image of the first component 11a sucked by the nozzle 8a of the first nozzle row by the first sensor 13, and performing pickup image of the third component 26a sucked by the nozzle 25a of the third nozzle row by the third sensor 29 are performed simultaneously. Further, the head is kept moving in the X direction, and at an instance when the nozzle 9a of the second nozzle row passes through the center of the second entrance port 18, that is, the center of the field of view of the second sensor 14, the shutter of the second sensor is opened so as to perform exposure, whereby performing pickup image of the second component 12a sucked by the nozzle 9a of the second nozzle row is performed by the second sensor 14. Further, the head is kept moving in the X direction, and at an instance when the nozzle 8b of the first nozzle row and the nozzle 25b of the third nozzle row pass through the centers of the fields of view of the first and third sensors 13 and 29, respectively, shutters of the first and third sensors 13 and 29 are opened so as to perform exposure, whereby imaging of the first component 11b sucked by the nozzle 8b of the first nozzle row by the first sensor 13, and imaging of the third component 26b sucked by the nozzle 25b of the third nozzle row by the third sensor 14 are performed simultaneously. Further, the head is kept moving in the X direction, and at an instance when the nozzle 9b of the second nozzle row passes through the center of the field of view of the second sensor 14, the shutter of the second sensor 14 is opened so as to perform exposure, and the second component 12b sucked by the nozzle 9b of the second nozzle row is imaged by the second sensor 14. Similarly, imaging of all components sucked by the fifteen nozzles arranged on the head is performed, although not shown. At the instances of imaging by using the shutter functions of the first, second or third sensors 13, 14 or 29, the light beam set for each component is irradiated by the first, second or third lighting unit 15, 16 and 27 with respect to the component to be imaged, by the control of the control unit 50. Note that if line sensors are used as the first, second and third sensors 13, 14 and 29, the sequence of imaging is similar to that in the case of using the area sensors, except that the first, second and third sensors 13, 14 and 29 keep taking image information during the components to be imaged passing through the fields of view of the first, second and third sensors 13, 14 and 29, and that the first, second and third lighting units 15, 16 and 27 keep irradiating light beams during the components to be imaged passing through the fields of view of the first, second and third sensors 13, 14 and 29, that is, during the first, second and third sensors 13, 14 and 29 keeping taking image information.

Note that the imaging sequence by the first, second and third sensors 13, 14 and 29, of the first components 11a and 11b, the second components 12a and 12b and the third components 26a and 26b sucked by the nozzles 8a and 8b of the first nozzle row, the nozzles 9a and 9b of the second nozzle row and the nozzles 25a and 25b of the third nozzle row in the above detailed explanation of the hold posture inspection, is an example in a case of the electronic component mounting apparatus 1 of a configuration in which the nozzle intervals between the nozzles 8a and 8b of the first nozzle row, the nozzles 9a and 9b of the second nozzle row, and the nozzles 25a and 25b of the third nozzle row, that is, the interval between the center of the nozzle 8a of the first nozzle row and the center of the nozzle 8b of the first nozzle row is larger than the interval in the X direction between the center of the first entrance port 17 and the center of the second entrance port 18. Sequence of components to be imaged when the center of the nozzle 8a of the first nozzle row and the center of the nozzle 8b of the first nozzle row is smaller than the interval in the X direction of the center of the first entrance port 17 and the center of the second entrance port 18 is not shown. In such a case, imaging of the first and third components 11a and 26a sucked by the nozzle 8a of the first nozzle row and the nozzle 25a of the third nozzle row are performed by the first and third sensors 13 and 29 simultaneously, next, imaging of the first and third components 11b and 26b sucked by the nozzle 8b of the first nozzle row and the nozzle 25b of the third nozzle row are performed by the first and third sensors 13 and 29 simultaneously, and then imaging of second components 12a sucked by the nozzle 9a of the second nozzle row is performed by the second sensor 14, then imaging of the second component 12b sucked by the nozzle 9b of the second nozzle row is performed by the second sensor 14. Further, Sequence of components imaged in a case where the interval between the center of the nozzle 8a of the first nozzle row and the center of the nozzle 8b of the first nozzle row coincides with the interval in the X direction between the center of the first entrance port 17 and the center of the second entrance port 18 is not shown. In such a case, first, imaging of the first and third components 11a and 26a sucked by the nozzle 8a of the first nozzle row and the nozzle 25a of the third nozzle row are performed simultaneously by the first and third sensors 13 and 29, respectively, then imaging of the first, second and third components 11b, 12a and 26b sucked by the nozzle 8b of the first nozzle row, the nozzle 9a of the second nozzle row and the nozzle 25b of the third nozzle row is performed simultaneously by the first, second and third sensors 13, 14 and 29, respectively, and then imaging of the second component 12b sucked by the nozzle 9b of the second nozzle row is performed by the second sensor 14.

With such a configuration, it is possible to independently set the light beams irradiated from the first, second and third lighting units 17, 18 and 27 to the first component 11a, the second component 12a and the third component 26a, and the first component 11b, the second component 12b and the third component 26b, passing above the inspection unit 7 while being aligned in the Y direction. Therefore, even in a case of a combination in which the first component 11a, the second component 12a and the third component 26a, and the first component 11b, the second component 12b and the third component 26b are viewed differently with the same light beam setting, so the accuracy of the posture inspection is insufficient or there is a component to which the posture inspection itself is impossible to perform, it is possible to perform pickup image for all components and perform a posture inspection with the head moving in the X direction and passing above the inspection unit 7 once, that is, with one scanning operation.

Further, since imaging is performed by using each of the first, second and third sensors 13, 14 and 29 for each row of the first nozzle row of the nozzles 8a and 8b, the second nozzle row of the nozzles 9a and 9b, and the third nozzle row of the nozzles 25a and 25b, that is, for each of the first components 11a and 11b, the second components 12a and 12b, and the third components 26a and 26b, it is possible to improve the accuracy of the hold posture inspection without causing the resolution per one pixel of the sensor to be rough, comparing with the case where the field of view is enlarged with one sensor so as to perform imaging of a plurality of components as the conventional art.

Further, in a state where the nozzle row intervals between the first nozzle row of the nozzles 8a and 8b, the second nozzle row of the nozzles 9a and 9b and the third nozzle row of the nozzles 25a and 25b provided on the head are narrow, and the respective centers of the fields of view of the first, second and third sensors 13, 14 and 29 of the inspection unit 7 are aligned in the X direction, there may be a case where arrangement spaces sufficient for the first, second and third lighting units 15, 16 and 27 cannot be obtained, and the accuracy of the hold posture inspection of the first, second and third components 11a and 11b, 12a and 12b, and 26a and 26b sucked by the nozzles 8a and 8b of the first nozzle row, nozzles 9a and 9b of the second nozzle row and the nozzles 25a and 25b of the third nozzle row cannot be secured since the light amount of the light beams irradiated from the first, second and third lighting units 15, 16 and 27 is insufficient. On the other hand, by arranging the first, second and third sensors 13, 14 and 29 such that the centers of the fields of view thereof are shifted in the X direction, it is possible to secure arrangement spaces for setting the first, second and third lighting units 15, 16 and 27 for irradiating light beams sufficient for securing the accuracy of the posture inspection, whereby it is possible to improve the accuracy of the posture inspection.

Further, with the configuration in which the centers of the fields of view of the first, second and third sensors 13, 14 and 29 are arranged in zigzag by shifting in the X direction, the spaces occupied in the X direction of the inspection unit 7 can be smaller comparing with the case in which the fields of view of the first, second and third sensors 13, 14 and 29 are arranged by being shifted sequentially in the X direction. Thereby, it is possible to make the inspection unit 7 compact, and further, since a distance that the head must move above the first, second and third entrance ports 17, 18 and 28 of the inspection unit 7 becomes shorter when imaging for the hold posture inspection of the first, second and third components 11a and 11b, 12a and 12b, and 26a and 26b sucked by the nozzles 8a and 8b of the first nozzle row and the nozzles 9a and 9b of the second nozzle row and the nozzle 25a and 25b of the third nozzle row provided on the head, it is possible to reduce the time required for imaging the first, second and third components 11a and 11b, 12a and 12b, and 26a and 26b, that is, the time required for the hold posture inspection.

Although not shown, the first, second and third sensors 13, 14 and 29 are not required to have the same range of vision and resolution, and sensors having different combinations of the range of vision and resolution can be arranged. By causing components of shapes optimum for the posture inspection to be sucked from the supplying parts 3 of the supplying unit 2 while considering each range of vision and each resolution of the first, second and third sensor 13, 14 and 29 with respect to the first components 11a and 11b, the second components 12a and 12b and the third components of 26a and 26b sucked by the nozzles 8a and 8b of the first nozzle row, the nozzles 9a and 9b of the second nozzle row and the nozzles 25a and 25b of the third nozzle row of the head, it is possible to increase kinds of components which are object of the hold posture inspection and to improve the accuracy of the posture inspection.

Fifth Embodiment

Next, a fifth embodiment of the present invention will be explained by using FIGS. 16 and 17.

The fifth embodiment of the present invention has similar configuration to that of the fourth embodiment, except that the reflecting/transmitting member 20 is disposed between the first, second and third entrance ports 17, 18 and 28 and the first, second and third sensors 13, 14 and 29, instead of the reflector 19, and spare sensors are additionally arranged on the transmitted light side of the reflecting/transmitting member 20. Therefore, similar constitutional parts are denoted by the same reference numerals and their explanations are omitted.

Figure 16:
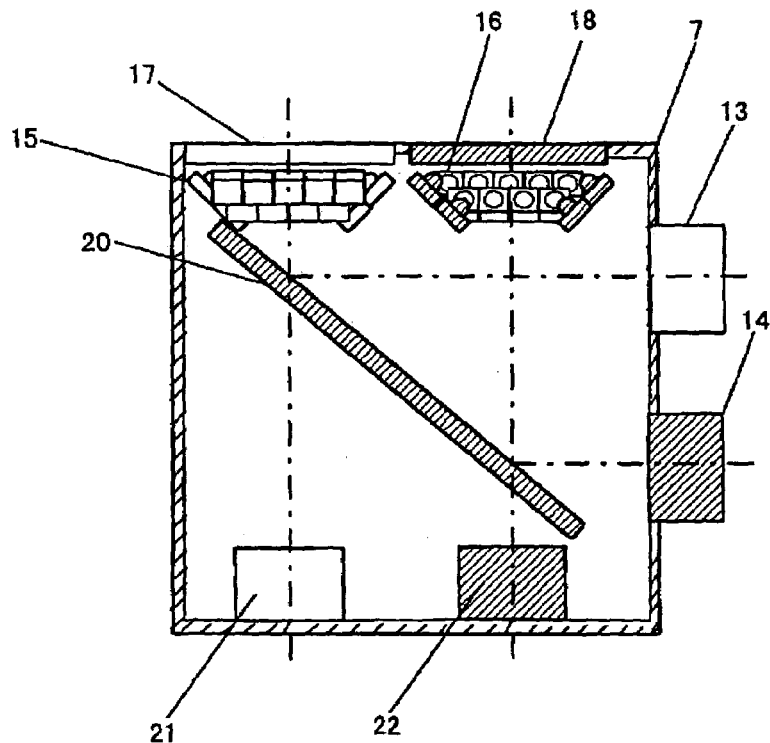
FIG. 16 is a sectional view showing an inspection unit of a fifth embodiment of the present invention.
Figure 17:
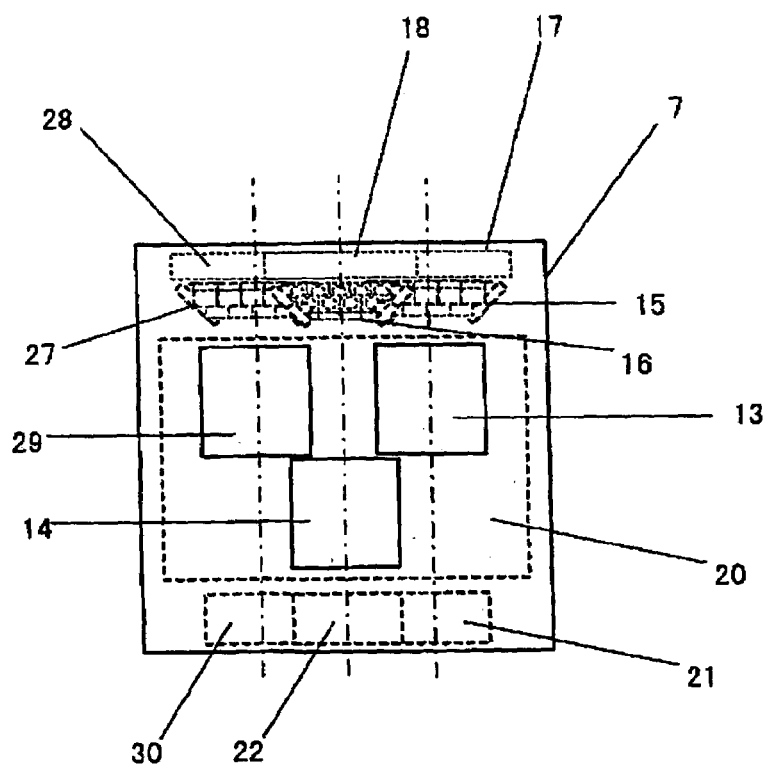
FIG. 17 is a side view showing the inspection unit of the fifth embodiment.

In FIGS. 16 and 17, the reference numeral 20 indicates a reflecting/transmitting member such as a half mirror, the reference numeral 13 indicates a first sensor provided on the reflected light side of the reflecting/transmitting member 20 and the reference numeral 21 indicates a first spare sensor provided on the transmitted light side of the reflecting/transmitting member 20, for performing pickup images of the first components 11*a* and 11*b* sucked by the nozzles 8*a* and 8*b* of the first nozzle row of the head 6. Similarly, the reference numeral 14 indicates a second sensor provided on the reflected light side of the reflecting/transmitting member 20 and the reference numeral 22 indicates a second spare sensor provided on the transmitted light side of the reflecting/transmitting member 20, for performing pickup images of the second components 12*a* and 12*b* sucked by the nozzles 9*a* and 9*b* of the second nozzle row of the head 6. Similarly, the reference numeral 29 indicates a third sensor provided on the reflected light side of the reflecting/transmitting member 20 and the reference numeral 30 indicates a third spare sensor provided on the transmitted light side of the reflecting/transmitting member 20, for performing pickup images of the third components 26*a* and 26*b* sucked by the nozzles 25*a* and 25*b* of the third nozzle row of the head 6. Here, the centers of the fields of view of the first sensor 13 and the first spare sensor 22, the centers of the fields of view of the second sensor 14 and the second spare sensor 22, and the centers of the fields of view of the third sensor 29 and the third spare sensor 30 are arranged so as to coincide with each other. Further, the first sensor 13 and the first spare sensor 21, and the second sensor 14 and the second spare sensor 22, and the third sensor 29 and the third spare sensor 30 may be combinations in which the resolutions or the ranges of vision are different respectively, or both of the resolutions and the ranges of vision are different.

As described above, with such a configuration that there exist two types of sensors in which the resolutions or the ranges of vision, or both of them are different for the hold posture inspection of each of the first components 11*a* and 11*b*, the second components 12*a* and 12*b* and the third components 26*a* and 26*b* sucked by the nozzles 8*a* and 8*b* of the first nozzle row, nozzles 9*a* and 9*b* of the second nozzle row and the nozzles 25*a* and 25*b* of the third nozzle row of the head 6, it is possible to improve the inspection accuracy of the hold posture or to increase object components of the posture inspection by selectively using the two types of sensors in accordance with the components to be imaged when imaging.

Sixth Embodiment

Next, a sixth embodiment of the present invention will be explained by using FIGS. 18 to 20.

The sixth embodiment of the present invention has the similar configuration to that of the fourth embodiment, except that the reflecting/transmitting member 20 is disposed between the first, second and third entrance ports 17, 18 and 28, and the first, second and third sensors 13, 14 and 29 instead of the reflector 19, and the second sensor 14 for performing imaging for the hold posture inspection of the second components 12*a* and 12*b* sucked by the nozzles 9*a* and 9*b* of the second nozzle row arranged on a side face of the inspection unit 7 is arranged on the transmitted light side of the reflecting/transmitting member 20, and that there is a limitation that lenses for the first, second and third sensors 13, 14 and 29 are arranged between the reflecting/transmitting member 20, and the first, second and third sensors 13, 14 and 29. Therefore, the similar constitutional parts are denoted by the same reference numerals, and their detailed explanations are omitted.

Figure 18:
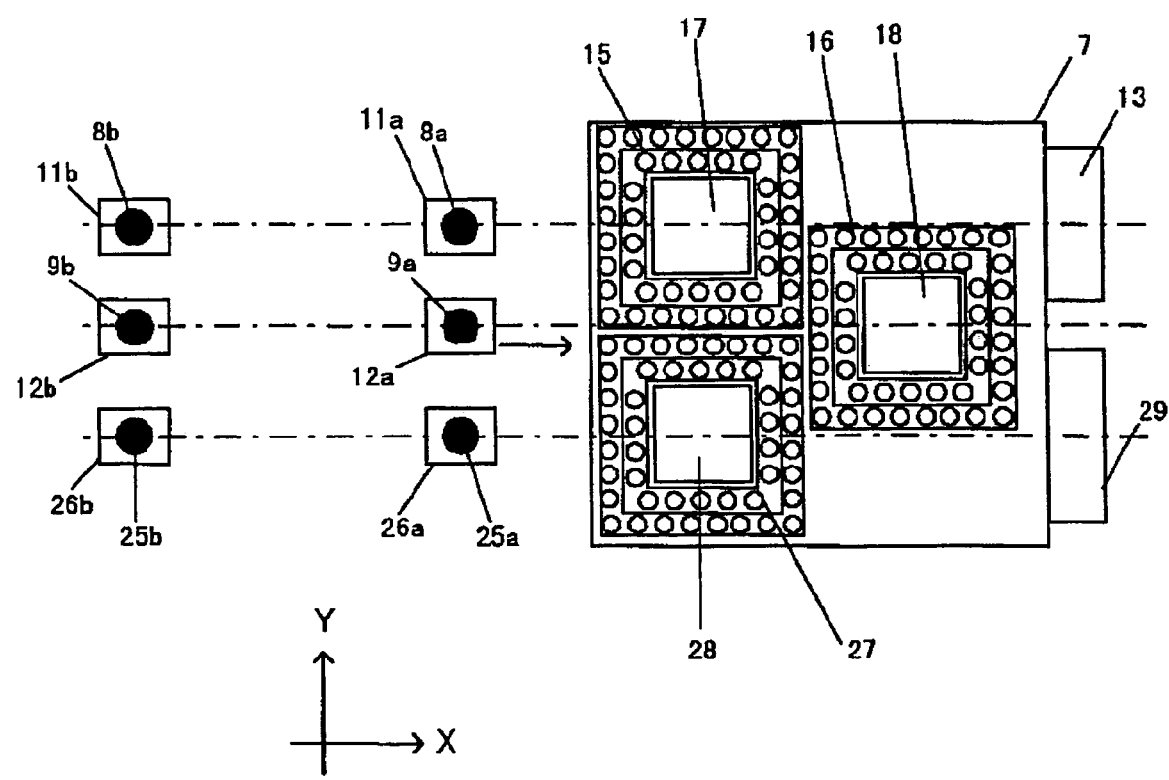
FIG. 18 is a plan view showing an inspection unit of a sixth embodiment of the present invention.
Figure 19:
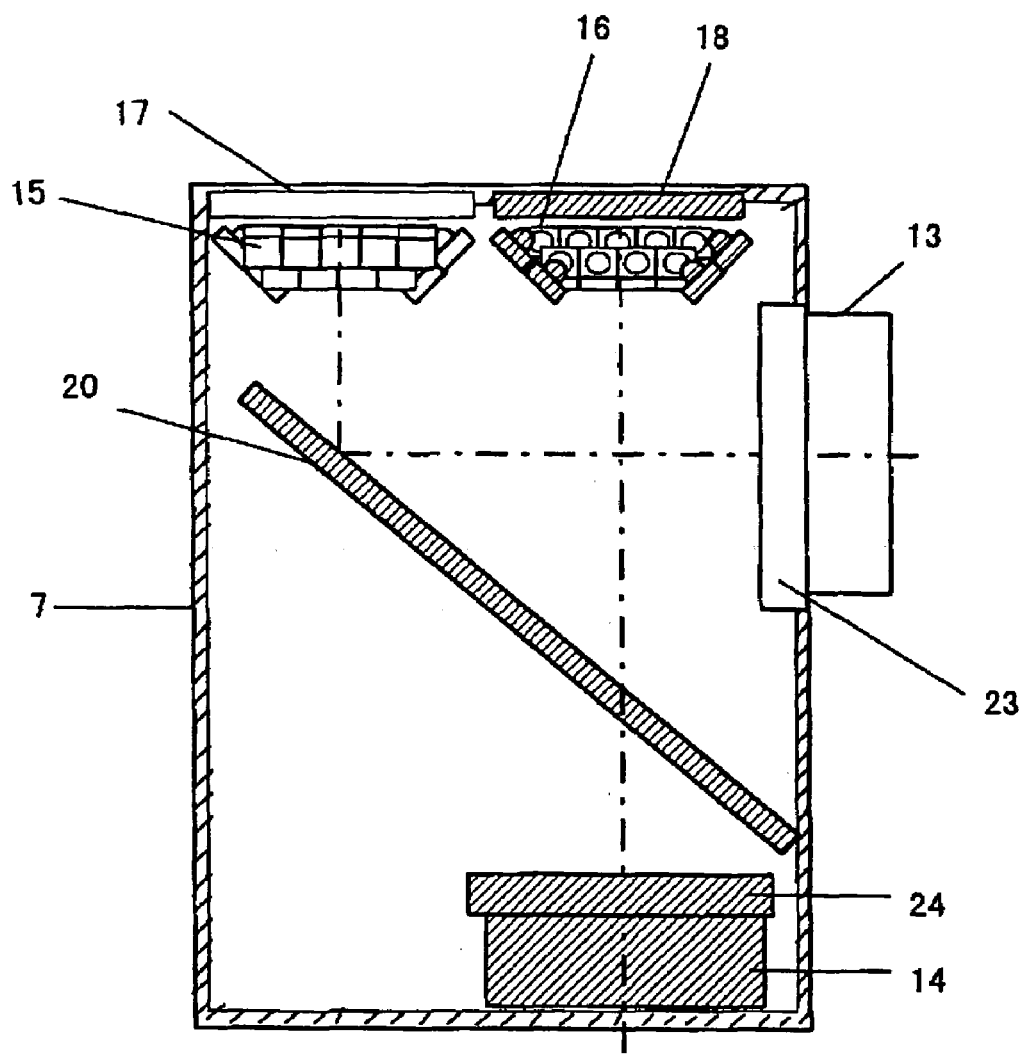
FIG. 19 is a sectional view showing the inspection unit of the sixth embodiment.
Figure 20:
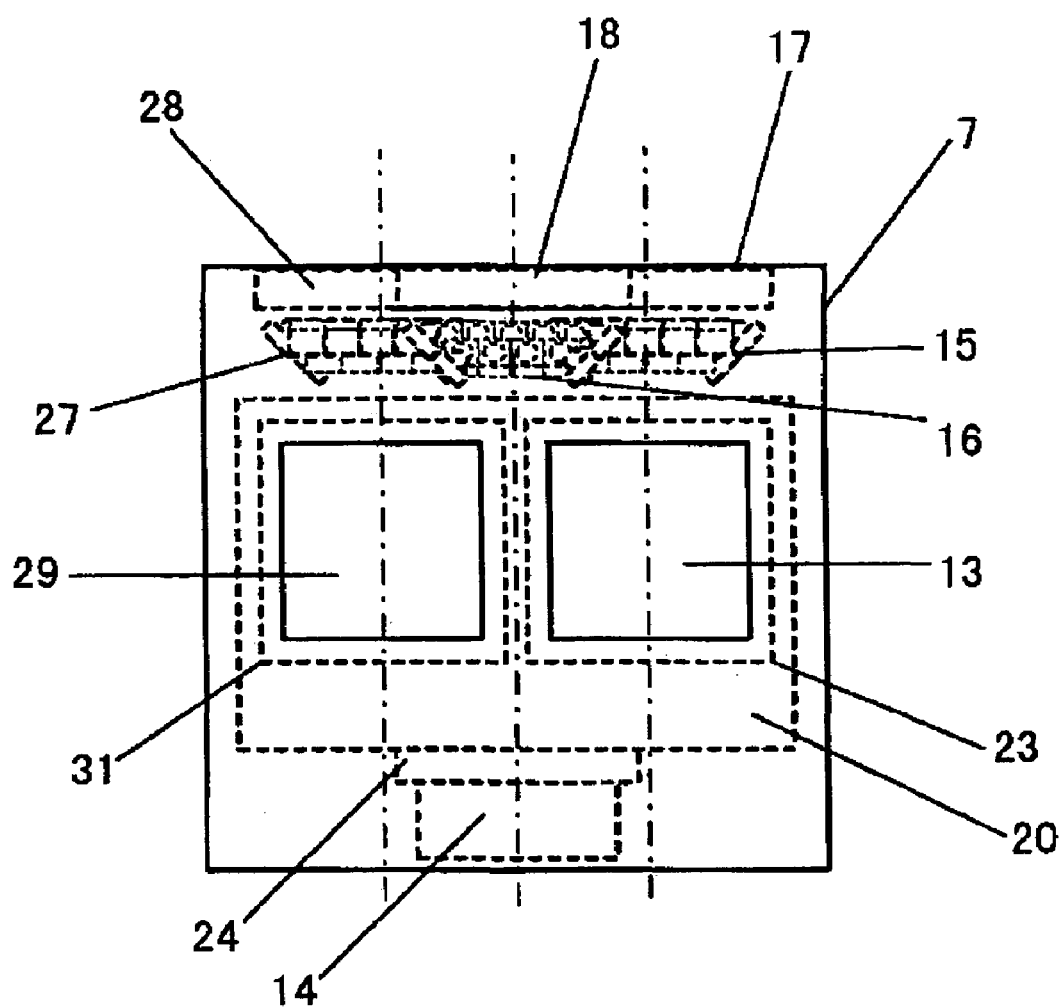
FIG. 20 is a side view showing the inspection unit of the sixth embodiment.

In FIGS. 18 to 20, the reference numeral 20 indicates the reflecting/transmitting member such as a half mirror provided between the first, second and third entrance ports 17, 18 and 28 and the first, second and third sensor 13, 14 and 29; the reference numeral and 23 indicates a first lens of the first sensor 13 for the hold posture inspection of the first components 11*a* and 11*b* sucked by the nozzles 8*a* and 8*b* of the first nozzle row of the head 6, which is provided between the reflecting/transmitting member 20 and the first sensor 13. The reference numeral 24 is a second lens of the second sensor 14 for the hold posture inspection of the second components 12*a* and 12*b* sucked by the nozzles 9*a* and 9*b* of the second nozzle row, which is provided between the reflecting/transmitting member 20 and the second sensor 14. The reference numeral 31 is a third lens of the third sensor 29 for the hold posture inspection of the third components 26*a* and 26*b* sucked by the nozzles 25*a* and 25*b* of the third nozzle row, which is provided between the reflecting/transmitting member 20 and the third sensor 29.

With such a configuration, even in a case where the first, second and third sensors 13, 14 and 29 are aligned on the same face such as a lower face or a side face of the inspection unit 7, if the outside dimensions of the first, second and third sensors 13, 14 and 29 are large so the intervals between the first, second and third entrance ports 17, 18 and 28 must be larger than necessary, that is, even in a case where the intervals between the first nozzle row of the nozzles 8*a* and 8*b* and the second nozzle row of the nozzles 9*a* and 9*b* and the third nozzle row of the nozzles 25*a* and 25*b* must be larger than as necessary, it is possible to reduce the intervals between the first nozzle row of the nozzles 8*a* and 8*b* and the second nozzle row of the nozzles 9*a* and 9*b* and the third nozzle row of the nozzles 25*a* and 25*b* provided on the head 6 by arranging the reflecting/transmitting member 20 between the first, second and third entrance ports 17, 18 and 28, and the first, second and third sensors 13, 14 and 29, and by alternately arranging the first, second and third sensors 13, 14 and 29 of the inspection unit 7 on the reflected light side and the transmitted light side of the reflecting/transmitting member 20, that is, by arranging the first and third sensors 13 and 29 on the reflected light side and the second sensor 14 on the transmitted light side. Thereby, the head 6 becomes compact. Further, since the intervals between the first, second and third entrance ports 17, 18 and 28 of the inspection unit 7 can be narrowed, the dimension in the Y direction of the inspection unit 7 can be compact.

Further, in a state where the intervals between the first nozzle row of the nozzles 8*a* and 8*b*, the second nozzle row of the nozzles 9*a* and 9*b*, and the third nozzle row of the nozzles 25*a* and 25*b* provided on the head 6 are narrow; and the first, second and third sensors 13, 14 and 29 are aligned on the same face such as a lower face or a side face of the inspection unit 7; there is a case that the lens diameter for the sufficient brightness for the first, second and third sensors 13, 14 and 29 cannot be secured, so the brightness of the light information taken into the first, second and third sensors 13, 14 and 29 are insufficient, so that the accuracy of the hold posture inspection of the first, second and third components 11*a* and 11*b*, 12*a* and 12*b*, and 26*a* and 26*b* sucked by the nozzles 8*a* and 8*b* of the first nozzle row and the nozzles 9*a* and 9*b* of the second nozzle row and nozzles 25*a* and 25*b* of the third nozzle row cannot be secured. Even in such a case, it is possible to enlarge the lens diameter by arranging the first, second and third lenses 23, 24 and 31 between the reflecting/transmitting member 20, and the first, second and third sensors 13, 14 and 29. Therefore, it is possible to improve the accuracy of the hold posture inspection of the first, second and third components 11a, 11b, 12a, 12b, 26a and 26b sucked by the nozzles 8a and 8b of the first nozzle row, nozzles 9a and 9b of the second nozzle row, nozzles 25a and 25b of the third nozzle row provided on the head 6.

Seventh Embodiment

Next, a seventh embodiment of the present invention will be explained by using FIGS. 21 to 24.

The seventh embodiment of the present invention has the similar configuration to that of the first embodiment, except that a common lighting unit and a common entrance port are provided with respect to the first and second sensors 13 and 14 of the inspection unit 7, and the center of the field of view of the first sensor 14 and the center of the field of view of the second sensor 14 are arranged to be shifted in the X direction. Therefore, the similar constitutional parts are denoted by the same reference numerals, and their detailed explanations are omitted.

Figure 21:
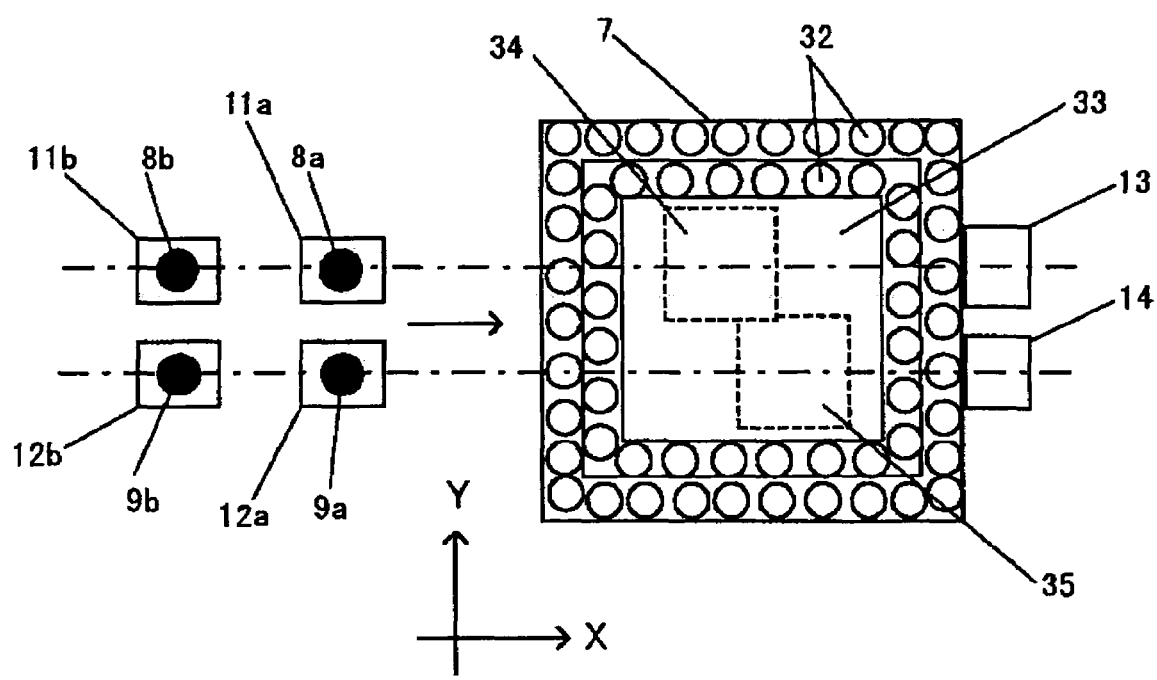
FIG. 21 is a plan view showing an inspection unit of a seventh embodiment of the present invention.
Figure 22:
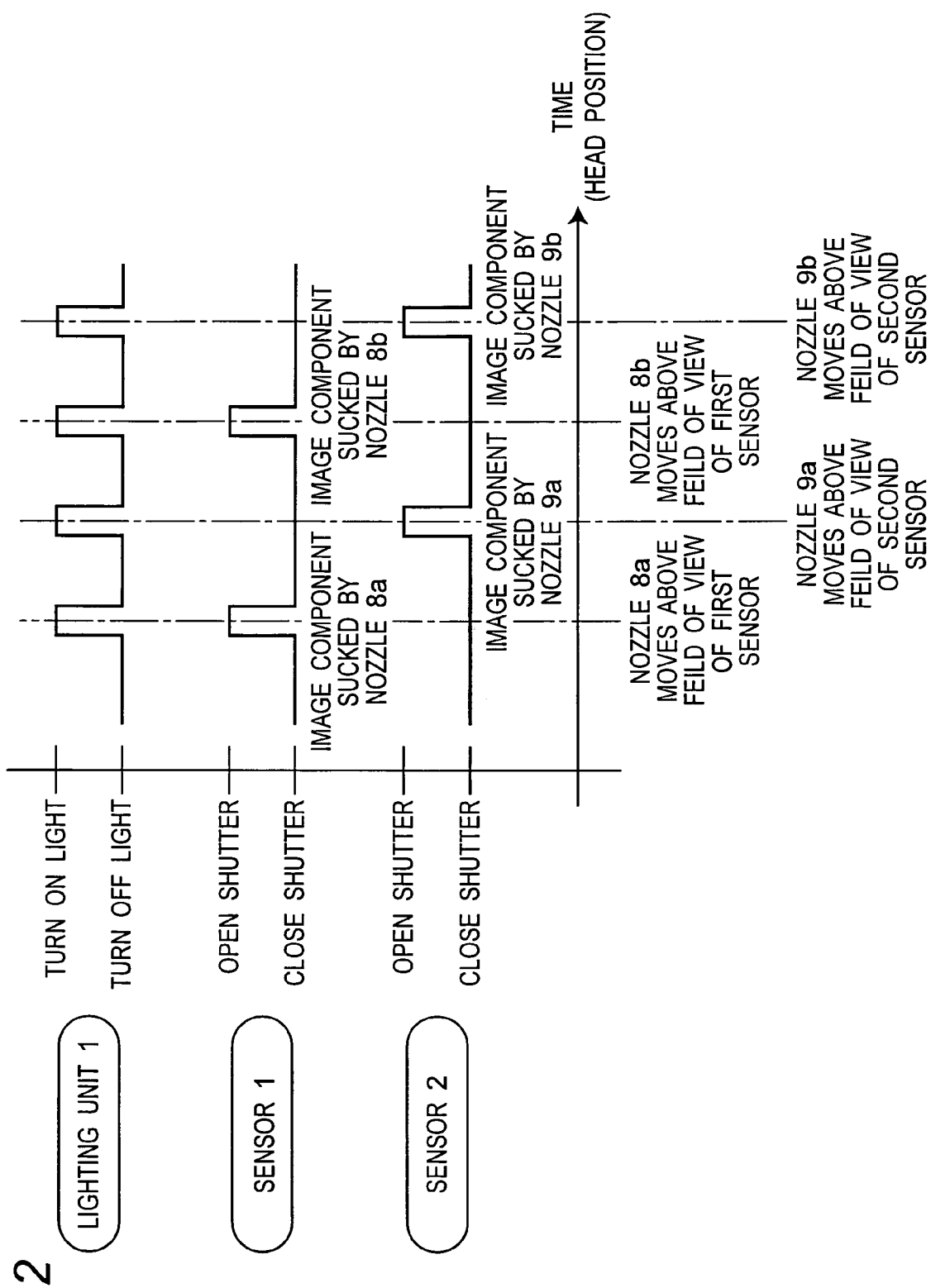
FIG. 22 is a timing chart of sensor imaging in the inspection unit of the seventh embodiment.
Figure 23:
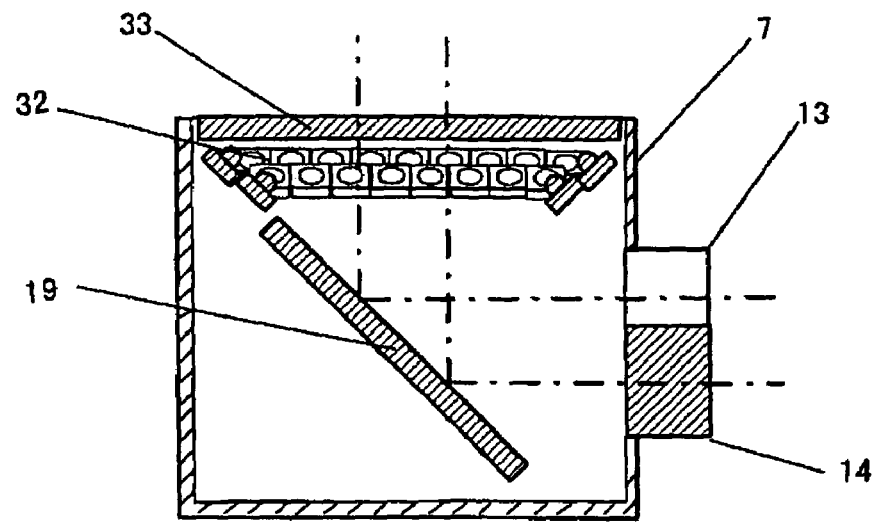
FIG. 23 is a sectional view showing the inspection unit of the seventh embodiment.
Figure 24:
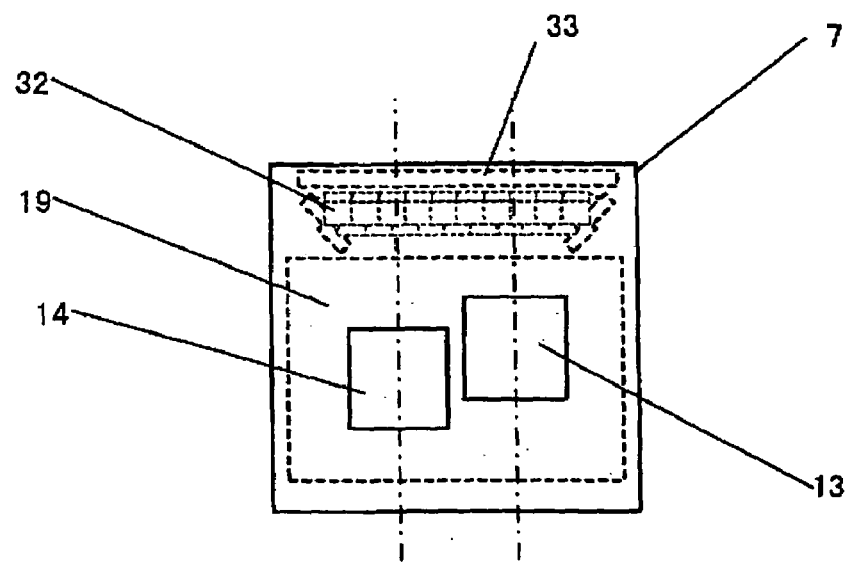
FIG. 24 is a side view showing the inspection unit of the seventh embodiment.

In FIG. 21, the reference numeral 32 indicate the common lighting unit for irradiating light beams to the first and second components 11a and 11b and 12a and 12b, when the first and second sensors 13 and 14 of the inspection unit 7 perform imaging of the first components 11a and 11b sucked by the nozzles 8a and 8b of the first nozzle row and the second components 12a and 12b sucked by the nozzles 9a and 9b of the second nozzle row of the head 6. The reference numeral 33 indicates the common entrance port for taking light information when the first and second sensors 13 and 14 perform imaging of the first components 11a and 11b and the second components 12a and 12b, respectively, and the lighting unit 32 is provided along the outer periphery of the entrance port 33. The reference numeral 34 indicates a first field of view showing an image taking range of the first sensor 13, and the reference numeral 35 indicates a second filed of view showing an image taking range of the second sensor 14. The center of the first field of view 34 and the center of the second field of view 35 are arranged to be shifted in the X direction. If the first and second sensors 13 and 14 are line sensors, the first field of view 34 and the second field of view 35 are arranged to be shifted in the X direction such that the end to end area occupied in the X direction with the first field of view 34 and the end to end area occupied in the X direction with the second field of view 35 are not overlapped with each other. Further, if the first and second sensors 13 and 14 are area sensors, the first field of view 34 and the second field of view 35 are arranged to be shifted in the X direction so as to keep a distance more than the distance that the head 6 moves above the inspection unit 7 during the shutters being opened when the first and second sensors 13 and 14 perform imaging, that is, during the exposure time of the first and second sensors 13 and 14.

Next, a hold posture inspection, in the inspection unit 7, of components sucked by the nozzles arranged on the head will be explained in detail.

When performing the hold posture inspection of the first components 11a and 11b and the second components 12a and 12b sucked by the nozzles 8a and 8b of the first nozzle row and the nozzles 9a and 9b of the second nozzle row arranged on the head 6, first, the head 6 is moved in the Y direction such that each of the first nozzle row of the nozzles 8a and 8b and the second nozzle row of the nozzles 9a and 9b, and each center of the fields of view of the first and second fields of view 34 and 35 of the inspection unit 7 coincide with each other. Then, as shown by the arrow in FIG. 21, the head 6 is moved in the X direction so as to pass above the inspection unit 7, and imaging is performed for each of the first and second components 11a and 11b, and 12a and 12b by the first and second sensors, respectively. If the first and second sensors 13 and 14 are area sensors, imaging of the first and second components 11a and 11b, and 12a and 12b is performed without causing the head 6 to stop temporarily above the first and second fields of view of the inspection unit 7 when the head 6 passes above the inspection unit 7, by using the shutter function of the first and second sensors 13 and 14. Specifically, as shown in the timing chart of FIG. 22, at an instance when the head 6 moves in the X direction above the inspection unit 7 and the nozzle 8a of the first nozzle row passes through the center of the first field of view 34 of the first sensor 13, the shutter of the first sensor 13 is opened so as to perform exposure, and imaging of the first component 11a sucked by the nozzle 8a of the first nozzle row is performed by the first sensor 13. Further, the head 6 is kept moving in the X direction, and at an instance when the nozzle 9a of the second nozzle row passes through the center of the second field of view 35 of the second sensor 14, the shutter of the second sensor 14 is opened so as to perform exposure, and imaging of the second component 12a sucked by the nozzle 9a of the second nozzle row is performed by the second sensor 14. Further, the head 6 is kept moving in the X direction, and at an instance when the nozzle 8b of the first nozzle row passes through the center of the first field of view 34, the shutter of the first sensor 13 is opened so as to perform exposure, and imaging of the first component 11b sucked by the nozzle 8b of the nozzle row is performed by the first sensor 13. Further, the head 6 is kept moving in the X direction, and at an instance when the nozzle 9b of the second nozzle row passes through the center of the second field of view 35, the shutter of the second sensor 14 is opened so as to perform exposure, and imaging of the second component 12b sucked by the nozzle 9b of the second nozzle row is performed by the second sensor 14. Similarly, imaging of all components sucked by the ten nozzles arranged on the head 6 is performed, although not shown. Note that at the instance of imaging using the shutter functions of the first and second sensors 13 and 14, a light beam set for each component is irradiated to the component to be imaged by the lighting unit 32. If line sensors are used as the first and second sensors 13 and 14, the imaging sequence is similar to that of the case using area sensors, except that image information is kept taking by the first and second sensors 13 and 14 during the time that the components to be imaged pass through the first and second fields of view 34 and 35, respectively, not using the shutter function of the sensors; and that light beams are kept irradiated by the lighting unit 32 during the time that the components to be imaged pass through the first and second fields of view 34 and 35, that is, during the time that the image information is kept taken by the first and second sensors 13 and 14.

In this way, by providing the common entrance port 33 and common lighting unit 32 along the outer periphery of the entrance port 33 with respect to the first and second sensors 13 and 14, it is possible to secure arrangement space for the lighting unit 32 irrespective of an interval which depends on a distance between the first nozzle row of the nozzles 8a and 8b and the second nozzle row of the nozzles 9a and 9b provided on the head 6 when the lighting units are arranged for the first and second sensors 13 and 14, and the centers of fields of view of the first and second sensors 13 and 14 are not shifted in the X direction but are aligned. Therefore, it is possible to easily constitute the lighting unit 32 for obtaining the light beam amount required for obtaining the inspection accuracy of a hold posture inspection of components sucked by the nozzles, and to improve the accuracy of the hold posture inspection of the first components 11*a* and 11*b* sucked by the nozzles 8*a* and 8*b* of the first nozzle row and the second components 12*a* and 12*b* sucked by the nozzles 9*a* and 9*b* of the second nozzle row.

Further, by arranging the first field of view 34 of the first sensor 13 and the second field of view 35 of the second sensor 14 to be shifted in the X direction, light beam setting can be performed independently for each imaging by the first and second sensors 13 and 14, that is, to the first component 11*a* and the second component 12*a* and the first component 11*b* and the second component 12*b*, passing in lines above the inspection unit 7 in the Y direction. Therefore, even in a case of a combination that the first component 11*a* and the second component 12*a* and the first component 11*b* and the second component 12*b* are viewed differently with the same light beam setting, and correspond to components that the accuracy of the posture inspection is insufficient or the posture inspection itself is impossible, imaging and posture inspection of all components become possible and the time required for the posture inspection is reduced with the head 6 moving in the X direction so as to pass above the inspection unit 7 once, that is, with only one scanning operation.

Eighth Embodiment

Next, an eighth embodiment of the present invention will be explained by using FIGS. 25 to 27.

The eighth embodiment of the present invention has a similar configuration to that of the seventh embodiment except that the reflecting/transmitting member 20 is disposed between the entrance port 33 and the first and second sensors 13 and 14, instead of the reflectance 19, and a spare sensor is added on the transmitted light side of the reflecting/transmitting member 20. The similar constitutional parts are denoted by the same reference numerals and their detailed explanations are omitted.

Figure 25:
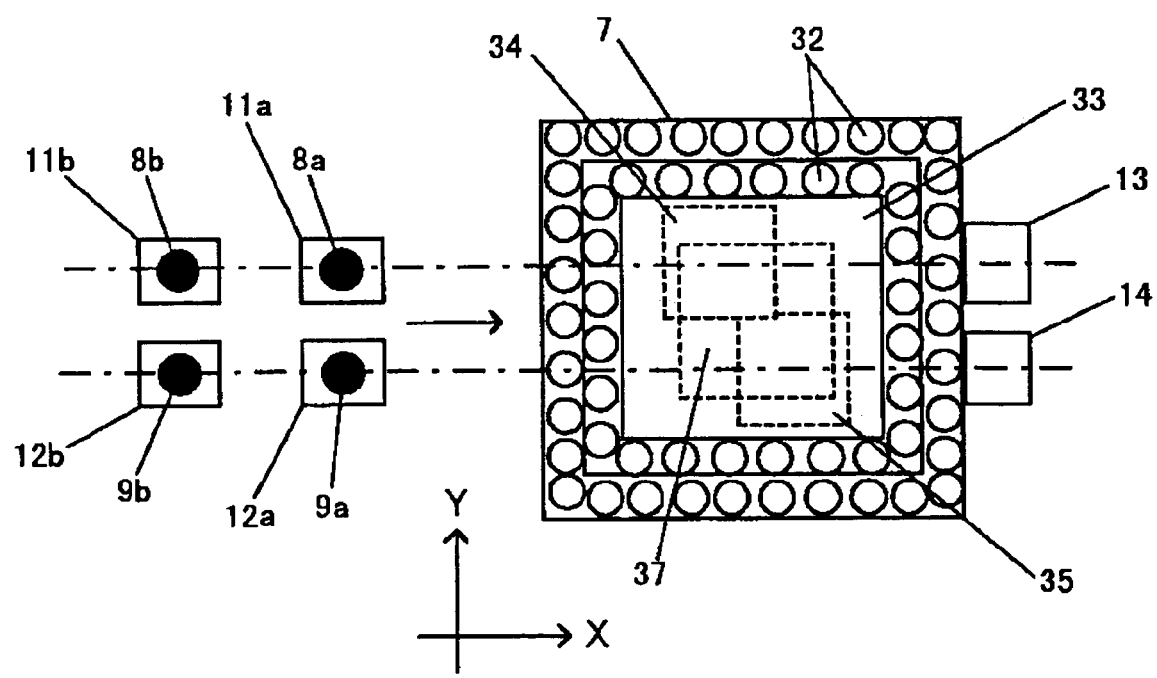
FIG. 25 is a plan view showing an inspection unit of an eighth embodiment of the present invention.
Figure 26:
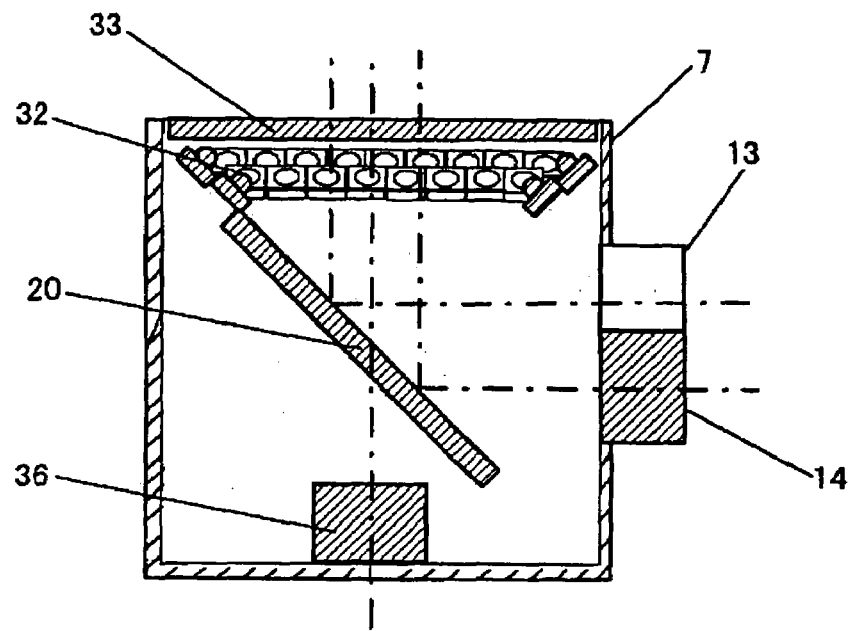
FIG. 26 is a sectional view showing the inspection unit of the eighth embodiment.
Figure 27:
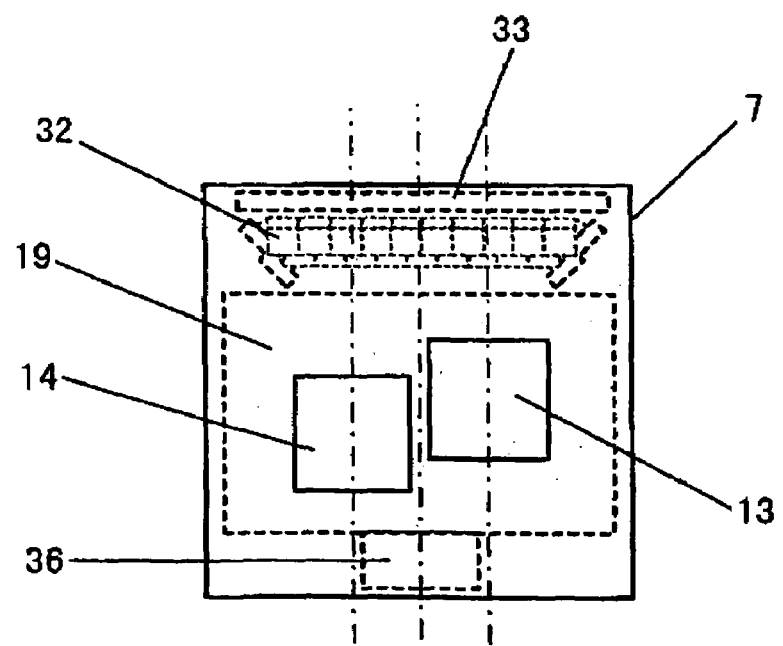
FIG. 27 is a side view showing the inspection unit of the eighth embodiment.

In FIGS. 25 to 27, the reference numeral 20 indicates the reflecting/transmitting member such as a half mirror provided between the entrance port 33 and the first and second sensors 13 and 14. The reference numeral 13 indicates a first sensor, provided on the reflected light side of the reflecting/transmitting member 20, for performing imaging of the first components 11*a* and 11*b* sucked by the nozzles 8*a* and 8*b* of the first nozzle row of the head 6, and the reference numeral 14 indicates a second sensor, provided on the reflected light side of the reflecting/transmitting member 20, for performing imaging of the second components 12*a* and 12*b* sucked by the nozzles 9*a* and 9*b* of the second nozzle row of the head 6. The reference numeral 36 indicates a fourth spare sensor provided on the transmitted light side of the reflecting/transmitting member 20, and the reference numeral 37 indicates a fourth field of view showing the image taking range of the fourth sensor 36. The field of view center of the fourth field of view 37 is arranged so as to coincide with the center of the entrance port 33. Further, the fourth field of view 37 is larger than the first field of view 34 showing the image taking range of the first sensor 13 and than the second field of view 35 showing the image taking range of the second sensor 14, and the outside dimension of the posture inspection object components of the fourth sensor 36 is set as larger than the outside dimension of the posture inspection object components of the first and second sensors 13 and 14. As specific examples, the ranges of vision of the first field of view 34 and the second field of view 35 are set to about 8 mm square, and electronic components of the outside dimensions of about 6 mm width and 3 mm height to small components of the outside dimensions of about 6 mm square; and the range of vision of the fourth field of view 37 is set to about 25 mm square or 35 mm square, and medium to large components of the outside dimensions of about 22 mm square or 32 mm square are to be the posture inspection objects.

Next, the hold posture inspection of components used for the fourth sensor 36 in the inspection unit 7 will be explained when there is a component which is the posture inspection object of the fourth sensor 36 among the first components 11*a* and 11*b* and the second components 12*a* and 12*b* sucked by the nozzles 8*a* and 8*b* of the first nozzle row and the nozzles 9*a* and 9*b* of the second nozzle row arranged on the head 6, first, the head 6 is moved in the Y direction such that a nozzle row of the first nozzle row of the nozzles 8*a* and 8*b* or the second nozzle row of the nozzles 9*a* and 9*b* arranged on the head 6 coincides with the Y directional position of the field of view center of the fourth sensor 36 of the inspection unit 7. Then, the head 6 is moved in the X direction so as to pass above the inspection unit 7, and imaging is performed for each component by the fourth sensor 16. If the fourth sensor 36 is an area sensor, imaging performed by the fourth sensor 36 is performed without causing the head 6 to be stopped temporarily above the fourth entrance port 37 of the inspection unit 7 when the head 6 passes above the inspection unit 7, by using the shutter function of the fourth sensor 36. Further, when imaging by the fourth sensor 36, a light beam set for each component is irradiated by the lighting unit 32 to the component to be imaged, with a control of the control unit 50.

A specific operation of the imaging will be explained (timing chart is not shown). If the first components 9*a* and 9*b* sucked by the nozzles 8*a* and 8*b* of the first nozzle row are object components of the posture inspection by the fourth sensor 36, the head 6 is moved in the Y direction to a position where the Y directional position of the first nozzle row of the nozzles 8*a* and 8*b* and the center of the fourth field of view 37 which is an image taking range of the fourth sensor 36 of the inspection unit 7 coincide with each other. Next, the head 6 is moved in the X direction toward the inspection unit 7, and at an instance when the nozzle 8*a* of the first nozzle row passes through the center of the fourth field of view 37 of the fourth sensor 36, the shutter of the fourth sensor 36 is opened so as to perform exposure, and imaging of the first component 11*a* sucked by the nozzle 8*a* of the first nozzle row is performed. Further, the head 6 is kept moving in the X direction, and at an instance when the nozzle 8*b* of the first nozzle row passes through the center of the fourth field of view 37 of the fourth sensor 36, the shutter of the fourth sensor 36 is opened so as to perform exposure, and imaging of the first component 11*b* sucked by the nozzle 8*b* of the first nozzle row is performed. In a case where the second components 12*a* and 12*b* sucked by the nozzles 9*a* and 9*b* of the second nozzle row are inspection object components of the fourth sensor 36, imaging is performed by the similar operation (expression of the operation is omitted). If line sensors are used as the first and second sensors 13 and 14, the imaging sequence is similar to that of the case of using area sensors, except that image information is kept taken by the first and second sensors 13 and 14 during the time that imaging object components pass through the field of view of the first and second sensors 13 and 14; and light beams are kept irradiated by the first and second lighting units 15 and 16 during the time that imaging object components pass through the field of view of the first and second sensors 13 and 14, that is, during the time that the first and second sensor 13 and 14 keep taking image information therein.

If components which are inspection object of the fourth sensor 36 are included in the first components 11a and 11b sucked by the nozzles 8a and 8b of the first nozzle row and the second components 12a and 12b sucked by the nozzles 9a and 9b of the second nozzle row, a scanning operation by the fourth sensor 36 to each of the first nozzle row and the second nozzle row (explanation of the operation is omitted).

Further, if posture inspection object components of the first and second sensors 13 and 14 and posture inspection object components of the fourth sensor 36 are included in a mixed manner in the first components 11a and 11b sucked by the nozzles 8a and 8b of the first nozzle row and the second components 12a and 12b sucked by the nozzles 9a and 9b of the second nozzle row, each of the following operations are required for performing posture inspection of all of the first components 11a and 11b and the second components 12a and 12b, that is: a scanning operation in which the head 6 moves in the X direction so as to pass above the inspection unit 7 for posture inspection object components performed by the first and second sensors 13 and 14, among the first components 11a and 11b sucked by the nozzles 8a and 8b of the first nozzle row and the second components 12a and 12b sucked by the nozzles 9a and 9b of the second nozzle row; a scanning operation for performing a posture inspection by the fourth sensor 36 with respect to the posture inspection object components of the fourth sensor 36 among the first components 11a and 11b sucked by the nozzles 8a and 8b of the first nozzle row; and a scanning operation for a posture inspection by the fourth sensor 36 with respect to posture inspection object components of the fourth sensor 36 among the second components 12a and 12b sucked by the nozzles 9a and 9b of the second nozzle row (explanation of the operation is omitted).

In this way, with a configuration in which the fourth sensor 36 having a different range of vision to that of the first and second sensors 13 and 14 is provided on the transmitted light side of the reflecting/transmitting member 20, and it is determined that a scanning operation of may be performed by using the first and second sensors 13 and 14 or using the fourth sensor 36 depending on the component outside dimensions of the first components 11a and 11b sucked by the nozzles 8a and 8b of the first nozzle row and the second components 12a and 12b sucked by the nozzles 9a and 9b of the second nozzle row, whereby it is possible to expand kinds of components which are object of the posture inspection.

Further, with such a configuration, if posture inspection object components of the first and second sensors 13 and 14 and posture inspection object components of the fourth sensor 36 are included in a mixed manner in the first component 11a and 11b sucked by the nozzles 8a and 8b of the first nozzle row and the second components 12a and 12b sucked by the nozzles 9a and 9b of the second nozzle row, the multiple numbers of scanning operations are required, so it takes time for the posture inspection. However, this is an effective configuration in a case where, in an electronic component mounting apparatus 1, mounting of square shaped chip components and small oddly shaped components prevails but mounting of medium-type to large-type of oddly shaped components is also required although seldom, that is, posture inspection object components by the first and second sensors 13 and 14 prevail but posture inspection object components by the fourth sensor are also required although seldom.

Although the difference of the resolutions between the fourth sensor 36, and the first and second sensors 13 and 14 is not described, it is possible to have a configuration to improve the posture inspection accuracy of the posture inspection object components of the fourth sensor 36, such that the fourth sensor 36, having the fourth field of view 37 of image taking range larger than the first and second field of views 34 and 35 which are image taking ranges of the first and second sensors 13 and 14, has a higher resolution than that of the first and second sensors 13 and 14.

Although one sensor, that is, the fourth sensor 36, is provided on the transmitted light side of the reflecting/transmitting member in the present embodiment, it is possible to provide the multiple number of sensors in which ranges of vision or resolutions are different or the both are different at arbitral positions within a region capable of disposed on the transmitted light side of the reflecting/transmitting member 20. More specifically, as shown in the embodiments 2 and 5, it is possible to have a configuration that two sensors are provided on the transmitted side of the reflecting/transmitting member 20 such that respective centers of the fields of view of the first field of view 34 which is the image taking range of the first sensor 13 and the second field of view which is the image taking range of the second sensor 14 coincide with those of the sensors; and the two sensors are selectively used when imaging, thereby expanding posture inspection object components and improving the accuracy of posture inspection.

Ninth Embodiment

Next, a ninth embodiment of the present invention will be explained by using FIGS. 28 to 30.

The ninth embodiment of the present invention has a similar configuration to that of the seventh embodiment except that the reflecting/transmitting member 20 is disposed between the entrance port 33 and the first and second sensors 13 and 14, instead of the reflector 19; the second sensor 14 performing imaging for the hold posture inspection of the second components 12a and 12b sucked by the nozzles 9a and 9b of the second nozzle row, which has been disposed on the side face of the inspection unit 7, is disposed on the transmitted light side of the reflecting/transmitting member 20; and lenses for the first and second sensors 13 and 14 are disposed between the reflecting/transmitting member 20 and the first and second sensors 13 and 14. Therefore, the similar constitutional parts are denoted by the same reference numerals, and their detailed explanations are omitted.

Figure 28:
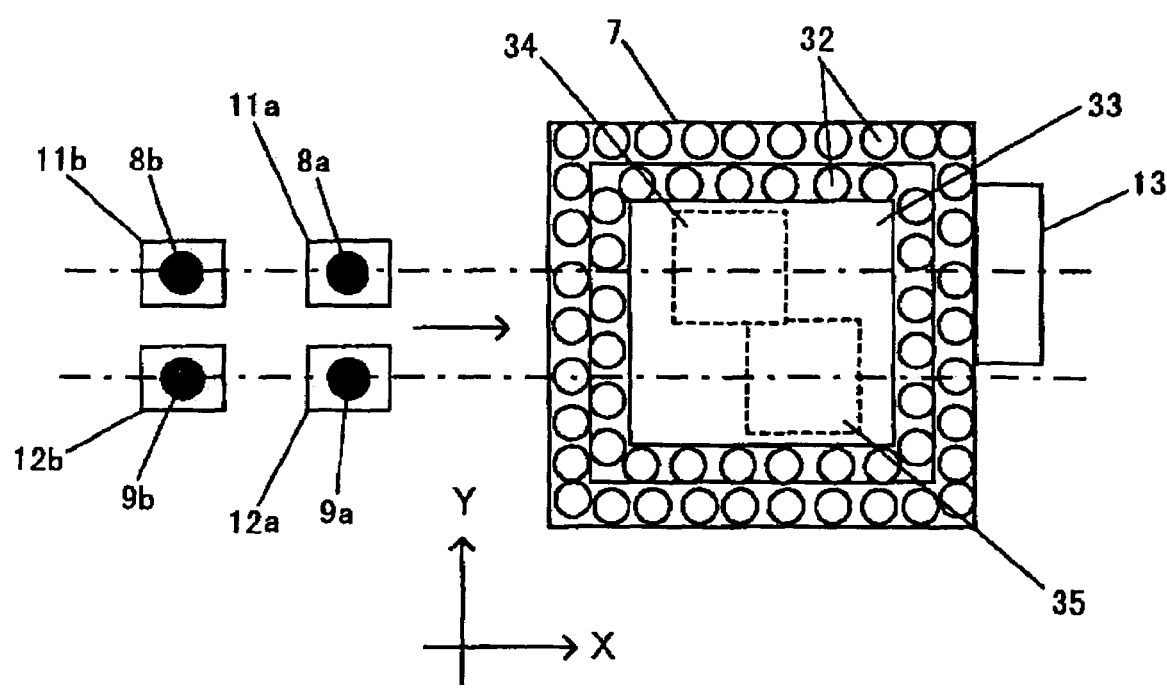
FIG. 28 is a plan view showing an inspection unit of a ninth embodiment of the present invention.
Figure 29:
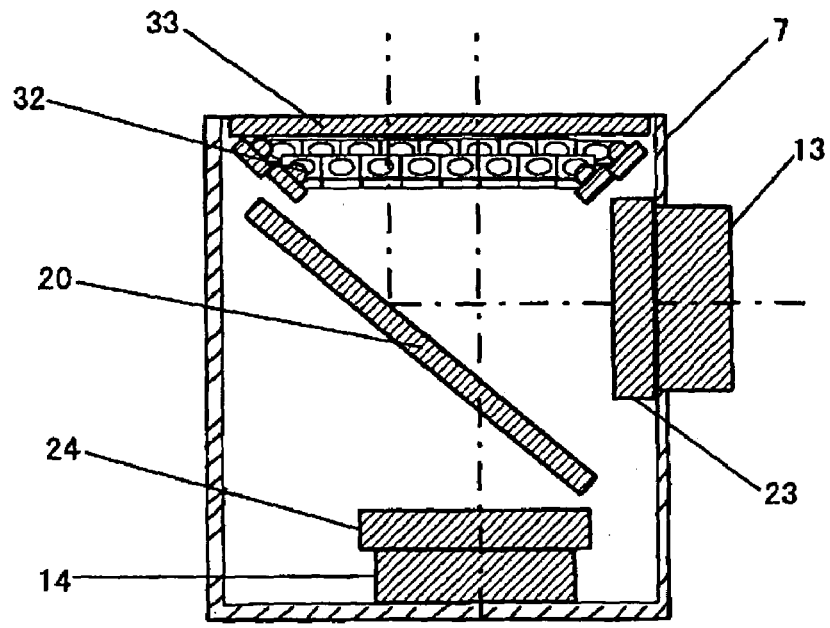
FIG. 29 is a sectional view showing the inspection unit of the ninth embodiment.
Figure 30:
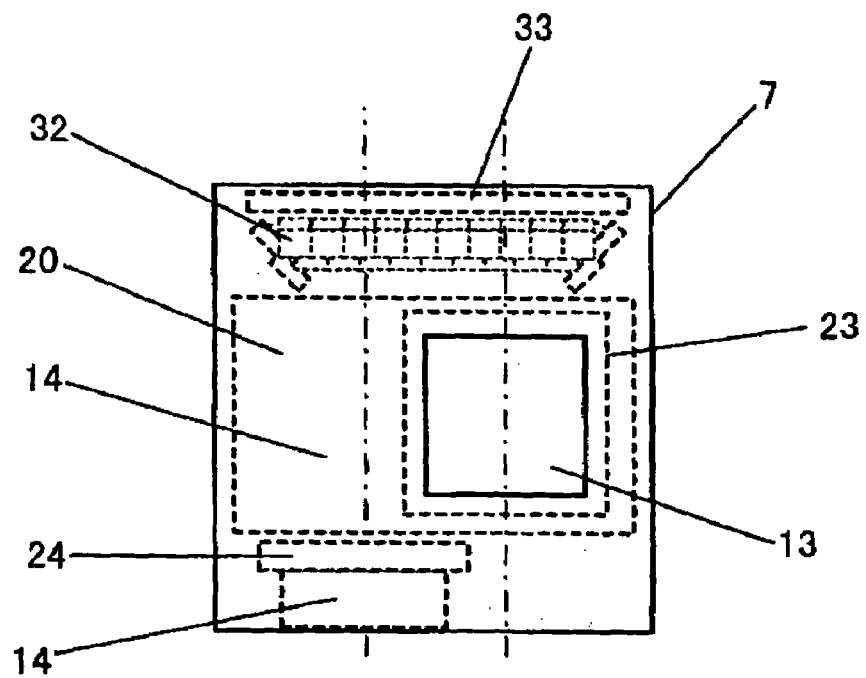
FIG. 30 is a side view showing the inspection unit of the ninth embodiment.

In FIGS. 28 to 30, the reference numeral 20 indicates the reflecting/transmitting member such as a half mirror provided between the entrance port 33 and the first and second sensors 13 and 14, and the reference numeral 23 indicates a first lens of the first sensor 13 for the hold posture inspection of the first components 11a and 11b sucked by the nozzles 8a and 8b of the first nozzle row of the head 6, which is disposed between the reflecting/transmitting member 20 and the first sensor 13. The reference numeral 24 is a second lends of the second sensor 15 for the hold posture inspection of the second components 12a and 12b sucked by the nozzles 9a and 9b of the nozzle 2, and is disposed between the reflecting/transmitting member 20 and the second sensor 14.

With such a configuration, even in a case where, when the first and second sensors 13 and 14 are arranged on the same face such as the lower face or the side face of the inspection unit 7, the interval between the first field of view 34 and the second field of view 35 must be larger than as required, that is, the interval between first nozzle row of the nozzles 8a and 8b and the second nozzle row of the nozzles 9a and 9b must be larger than as required because of the large outside dimensions of the first and second sensors 13 and 14, it is possible to reduce the interval between the first nozzle row of the nozzles 8a and 8b and the second nozzle row of the nozzles 9a and 9b arranged on the head 6 by providing the reflecting/ transmitting member 20 between the entrance port 33 and the first and second sensors 13 and 14, and alternatively arranging the sensors of the inspection unit 7 on the reflected light side and the transmitted light side in the reflecting/transmitting member 20, that is, disposing the first sensor 13 on the reflected light side and the second sensor 14 on the transmitted light side, whereby the head 6 can be compact. Further, since the interval between the first field of view 34 and the second field of view 35 of the inspection unit 7, the dimension of the inspection unit 7 in the Y direction can be compact.

Further, in a state where the interval between the first nozzle row of the nozzles 8a and 8b and the second nozzle row of the nozzles 9a and 9b is narrow and the first and second sensors 13 and 14 are arranged on the same face such as the lower face or the side face of the inspection unit 7, even in a case where lens diameters for the brightness sufficient for the first and second sensors 13 and 14 cannot be secured and the brightness of the light information taken into the first and second sensors 13 and 14 is insufficient, so that the accuracy of the hold posture inspection of the first and second components 11a and 11b, and 12a and 12b sucked by the nozzles 8a and 8b of the first nozzle row and the nozzles 9a and 9b of the second nozzle row cannot be secured, it is possible to enlarge the lens diameters for the sensors by arranging the first and second lenses 23 and 24 between the reflecting/transmitting member 20, and the first and second sensors 13 and 14. Thereby, it is possible to improve the accuracy of the hold posture inspection of the first and second components 11a and 11b, and 12a and 12b sucked by the nozzles 8a and 8b of the first nozzle row and the nozzles 9a and 9b of the second nozzle row provided on the head 6.

As described above, the present invention is so configured that the inspection unit includes independent sensors for posture inspection for each nozzle row arranged on the head, the lighting units for irradiating light beams to the head when the posture inspection is performed, and the entrance port for the light information. Thereby, it is possible to perform the hold posture inspection of a plurality of components sucked by a plurality of nozzle rows provided on the head with one scanning operation, so that the time required for the hold posture inspection can be reduced. Further, it is possible to improve the accuracy of the hold posture inspection of the components held by the nozzles, and to improve the productivity of the electronic component mounting apparatus.

Tenth Embodiment

Further, an component mounting apparatus which is a tenth embodiment of the present invention and a component mounting method executed in the component mounting apparatus will be explained below with reference to the drawings.

Figure 31:
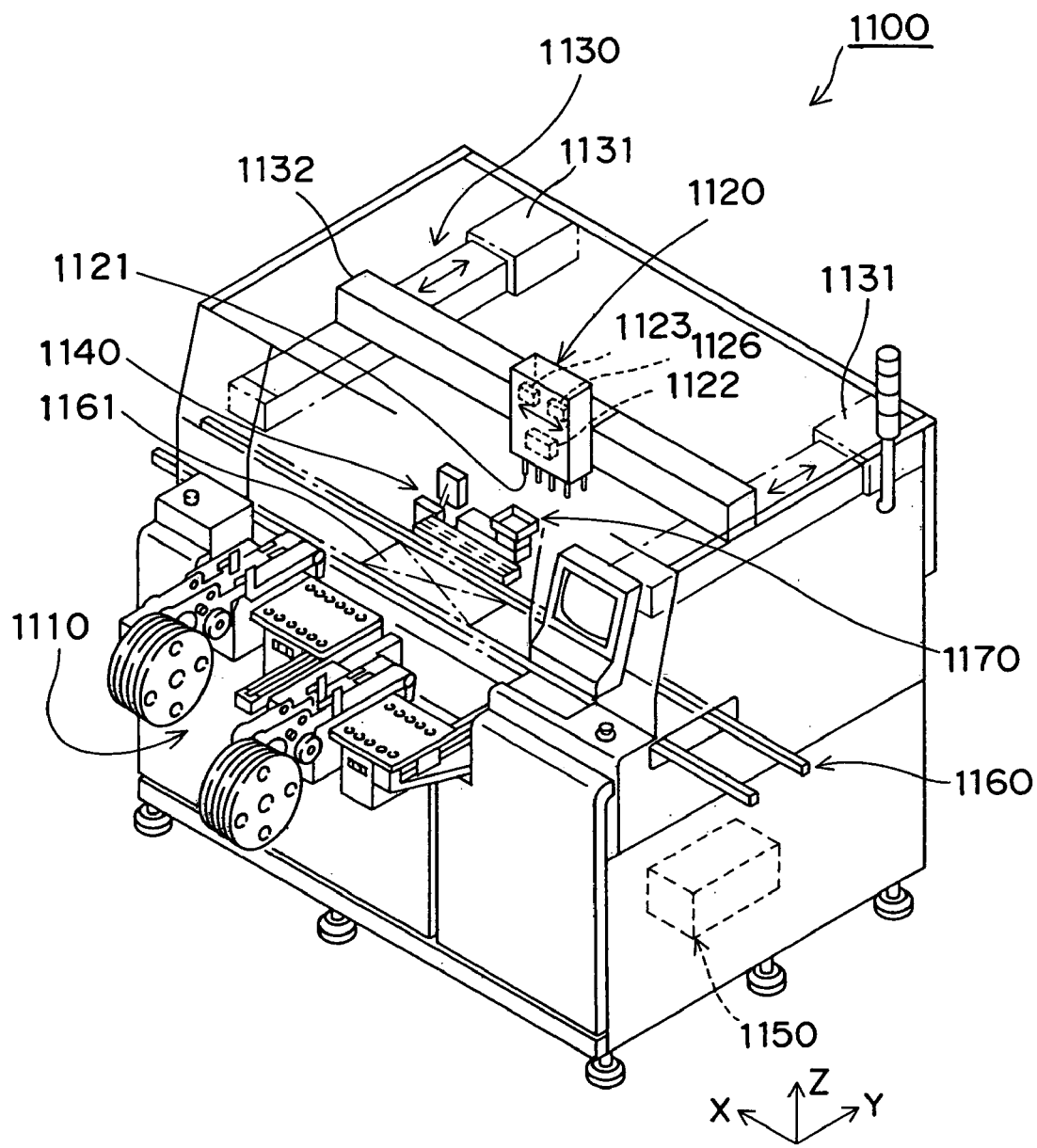
FIG. 31 is a perspective view showing a component mounting apparatus which is a tenth embodiment of the present invention.

A component mounting apparatus 1100 of the tenth embodiment shown in FIG. 31 includes, as the basic constitutional units, an electronic component supplying device 1110, a component holding head 1120, an X, Y-robot 1130, a component height detecting device 1140, and a control device 1150, and further includes a circuit board conveying device 1160 and a component recognizing device 1170 in the present embodiment.

The component supplying device 1110 is a device for supplying electronic components 1111. In the present embodiment, component supplying devices of a so-called tape feeder type are provided, each of which includes a reel around which a tape accommodating the electronic components 1111 is winded and supplies components by taking out the tape from the reel. Note that the component supplying device is not limited to the tape feeder type, but may be a tray feeder type.

Figure 32:
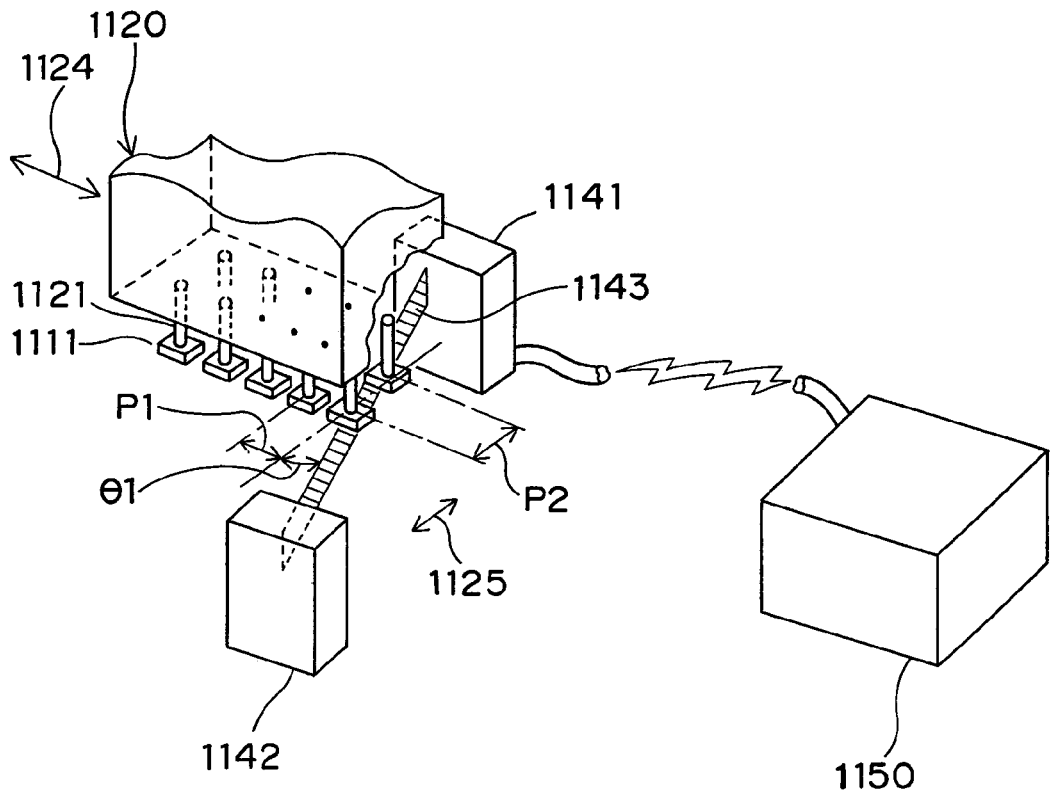
FIG. 32 is a perspective view for explaining an operation of detecting component height performed in the component height detection device shown in FIG. 31.
Figure 33:
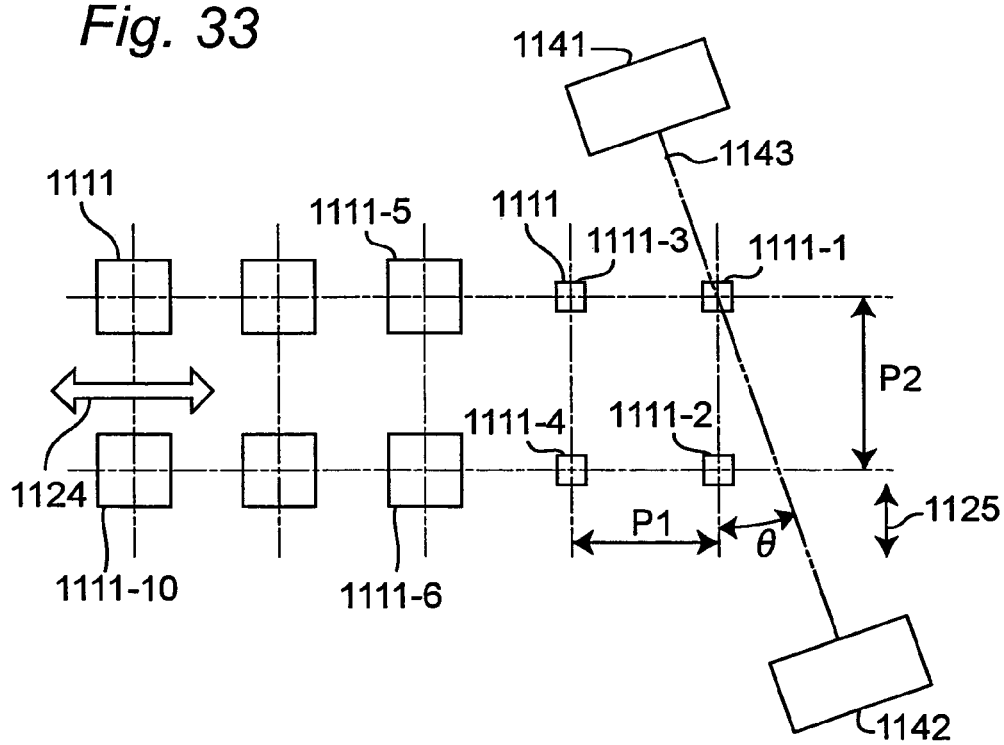
FIG. 33 is a plan view for explaining an operation of detecting component height performed in the component height detecting device shown in FIG. 31.

The component holding head 1120 has component holding members 1212 for holding electronic components 1111. As shown in FIGS. 32 and 33, the component holding members 1121 are arranged in a lattice state with a plurality of lines and a plurality of rows along X and Y directions. In the present embodiment, ten component holding members 1121 in total are arranged with two lines in an X direction and five rows in a Y direction. In the present embodiment, an arrangement interval P1 between the respective component holding members 1121 in a moving direction 1124 along the X direction is 10.75 mm for example, and an arrangement interval P2 between the respective component holding members in an orthogonal direction 1125 to the moving direction 1124 along the Y direction is 22 mm for example. Further, in the present embodiment, the respective component holding members 1121 serve as suction nozzles holding the components 1111 by suction, and the component holding head 1120 has a suction unit 1122 for the suction, and further, a lifting unit 1123 for lifting the component holding members 1121 in an axial direction when the components are held and mounted, and a rotating unit 1126 for rotating the component holding members 1121 about their axes.

The X, Y-robot 1130 is a robot for moving the component holding head 1120 in the X and Y directions, which includes a pair of Y-robots 1131 extending in the Y direction and having ball screw mechanisms, and an X-robot 1132 which extends in the X direction and the both ends of which are supported by each Y-robot 1131 so as to be movable in the Y direction by the Y-robots 1131 and has a ball screw mechanism to which the component holding head 1120 is attached and which makes the component holding head 1120 move along the X direction. The component holding head 1120 is movable in the X and Y directions by the X, Y-robot 1130.

The component height detecting device 1140 is a device for detecting the heights of the components 1111 held by the component holding members 1121 in order to inspect the good or bad quality of the holding postures of the components 1111 held by a plurality of component holding members 1121. The component height detecting device 1140 includes a light emitting unit 1141 for emitting light for detection 1143 consisting of parallel luminous flux, and a light receiving unit 1142 having a one-dimensional image sensor for receiving the light for detection 1143 emitted from the light emitting unit 1141. As shown in FIGS. 32 and 33, the light emitting unit 1141 and the light receiving unit 1142 are arranged on both sides of the moving direction 1124 of the component holding members 1121 so as to interpose the component holding members 1121 moved by the component holding head 1120, and are arranged so that the light for detection 1143 emitted from the light emitting unit 1142 cross at a detectable angle θ enabling to detect each of the components 1111 held by each of the component holding members 1121 with respect to an orthogonal direction 1125 orthogonal to the moving direction 1124. Note that in the present embodiment, the moving direction corresponds to the X direction and the orthogonal direction 1125 orthogonal to the moving direction 1124 corresponds to the Y direction.

The detectable angle θ is an angle which can be obtained from $\tan^{-1}((P1/2)/P2)$, where P1 is the arranging interval between the respective component holding members 1121 in the moving direction 1124, and P2 is the arranging interval of the respective component holding members 1121 in the orthogonal direction 1125.

For example, in a case where the arranging interval P1 of the respective component holding members 1121 is 10.75 mm, and the arranging interval P2 is 22 mm, the detectable angle θ is 14 degrees.

The control device 1150 is a device for performing an operational control of the component mounting device 1100, and is connected with the component height detecting device 1140, and determines the quality of the holding postures of the components 1111 based on component height information supplied from the component height detecting device 1140.

Figure 34:
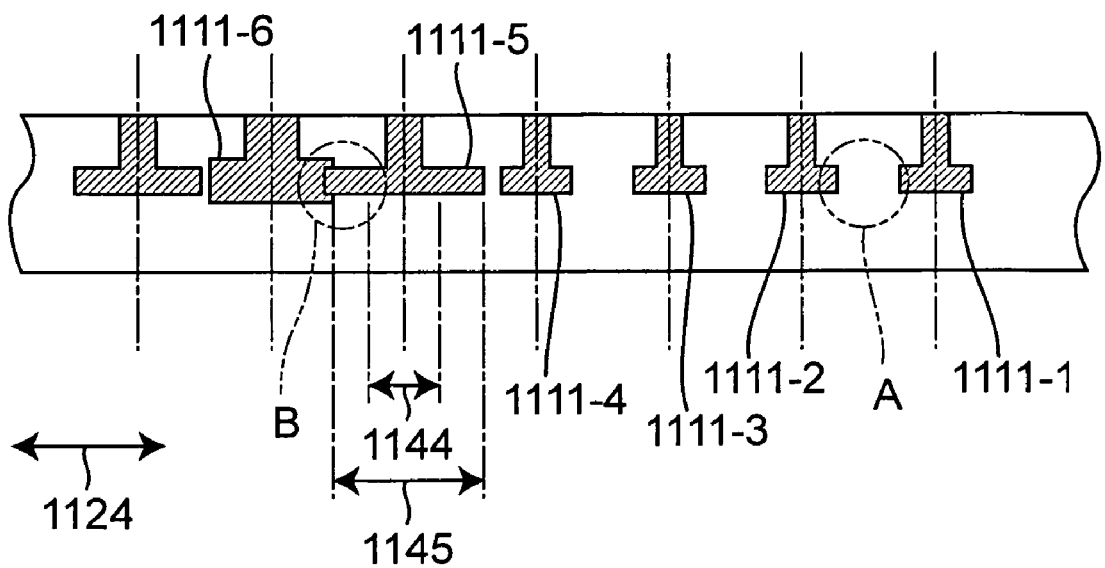
FIG. 34 is a diagram showing images of components obtained in the component height detection device shown in FIG. 31.

FIG. 34 shows images of the light for detection 1143 which is emitted from the light emitting unit 1141 of the component height detecting device 1140 arranged at the detectable angle θ, and passes through the components 1111 held by the respective component holding members 1121 and then detected by the light receiving unit 142. As shown in FIG. 34, due to the sizes of the components 1111 held by the respective holding members 1121, there may be a case where gaps are generated between images of the respective components 1111 as shown in a part A of FIG. 34, and a case where images of the respective components are overlapped so no gap is generated as shown in a part B.

Thus, in order to enable to determine the quality of the hold posture for each of the component 1111 even in the case that the images of the components 1111 overlap, in the control device 1150 in the present embodiment, the quality of the hold posture for each electronic component 1111 is determined based on the component height information at each detecting section 1144 including the center of each component holding member 1121 in the moving direction 1124 among the component height information sent by the component height detecting device 1140, as shown in FIG. 34. As obvious from the part B of FIG. 34, the detecting section 1144 is a section capable of being set within a non-overlapping area 1145 in which overlapped parts are excluded in the respective images of the adjacent electronic components 1111. Specifically, the non-overlapping area 1145 is an area corresponding to P2×sin θ at a maximum. Further, the detecting section 1144 is 3 mm long in the present embodiment. This is because a fine chip component such as 1608 (1.6 mm×0.8 mm) cannot be determined for the hold posture only with a planar recognition.

In the present embodiment, as for the detecting section 1144, the same distance is applied with respect to all component holding members 1121. However, the detecting section 1144 may be changed in each component holding member 1121 corresponding to the size or the like of the component holding member 1121.

The circuit board conveying device 1160 conveys a circuit board 1161 to the component mounting device 1100, and after the components are mounted, conveys the circuit board 1161 from the component mounting device 1100 to a next process.

The component recognizing device 1170 is a device for performing pickup images of the hold postures of the electronic components 1111 held by the component holding members 1121 of the component holding head 1120 in a planer manner, and is connected with the control device 1150. The control device 1150 calculates position correction amount for mounting the component 1111 on the circuit board 1161 based on each of the hold posture information of the component 1111 supplied from the component recognizing device 1170.

The operation of the component mounting device 1100 of the tenth embodiment configured as described above, that is, a component mounting method, will be explained below. Note that the component mounting method is executed by the operational control of the control device 1150.

The circuit board 1161 is carried in the component mounting device 1100 from the upstream side of the component mounting device 1100, and by the circuit board conveying device 1160, the circuit board 1161 is conveyed and fixed to a circuit board holding position for mounting components within the component mounting device 1100.

Next, in order to take out the electronic components 1111, conveyed to a component suction device by the component supplying device 1110, with the component holding members 1121 of the component holding head 1120, the component holding head 1120 is positioned over the component suction device by the X, Y-robot 1130, and then the components 1111 are held by the component holding members 1121. Since the component holding head 1120 has a plurality of component holding members 1121, the components 1111 are held by a plurality of component holding members 1121 of at least the number required for mounting the components according to a component mounting program stored on the control device 1150.

After the electronic components 1111 are held by the component holding members 1121, in order to confirm the hold state of the electronic components 1111 at the component holding members 1121 in a planar manner, the component holding head 1120 is conveyed to and positioned at a recognizing position of the component recognizing device 1170 by the X, Y-robot 1130. The component recognizing device 1170 performs pickup images of the planar state of the respective electronic components 1111 held by the component holding members 1121, and sends respective pieces of imaging information to the control device 1150. Based on the imaging information, the control device 1150 calculates a correction amount for each electronic component 1111 so as to coincide with the mounting position in the circuit board 1161, and according to the correction amount, corrects the moving amounts of the X, Y-robot 1130 and the component holding members 1121.

Next, in order to determine the quality of the component hold postures by detecting, in a height direction, the respective electronic components 1111 held by the component holding members 1121, the component holding head 1120 is move-controlled by the X, Y-robot 1130 so as to pass between the light emitting unit 1141 and the light receiving unit 1142 of the component height detecting device 1140 for the respective electronic components 1111 as shown in FIG. 32. At this time, the component holding members 1121 provided on the component holding head 1120 passes between the light emitting unit 1141 and the light receiving unit 1142 in a state that the electronic components 1111 are positioned at a detection height position which is a certain height in a Z direction.

As described above, since the light for detection 1143 emitted from the light emitting unit 1141 crosses the orthogonal direction 1125 at the detectable angle θ, although the electronic components 1111 are arranged in two lines and five rows in the present embodiment as described above, the respective electronic components 1111 are inspected sequentially in the order of, for example, a component 1111-1, a component 1111-2, a component 1111-3, a component 1111-4, a component 1111-5, . . . and a component 1111-10 as shown in FIG. 33, by moving the component holding head 1120 in the moving direction 1124. Therefore, as shown in FIG. 34, images of the respective electronic components 1111 are detected sequentially by the light receiving unit 1142, and the pieces of image information detected are sent to the control device 1150 sequentially.

In this way, since the light for detection 1143 emitted from the light emitting unit 1141 crosses the orthogonal direction 1125 at the detectable angle θ, even in the case that the component holding members 1121 are arranged in a plurality of lines and a plurality of rows, it is possible to obtain the image information for all components 1111 with one scanning. Therefore, according to the component mounting device 1100 of the present embodiment, it is possible to speed-up the cycle time relating to mounting components, comparing with the conventional case.

Figure 35:
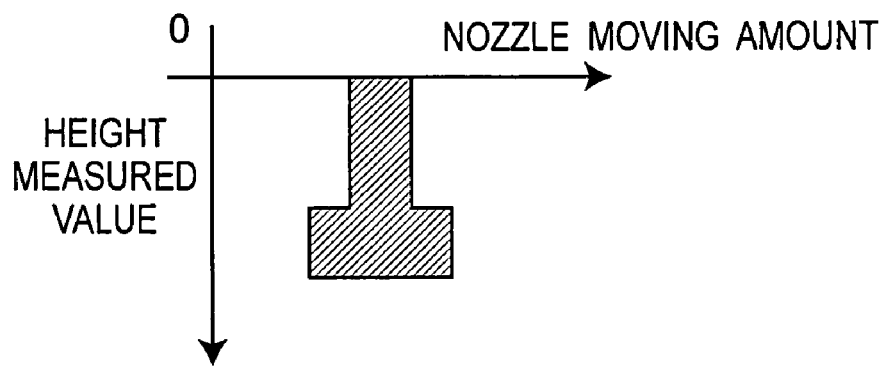
FIG. 35 is a diagram for explaining how to obtain a component height based on the image of a component obtained in the component height detection device shown in FIG. 31.
Figure 36:
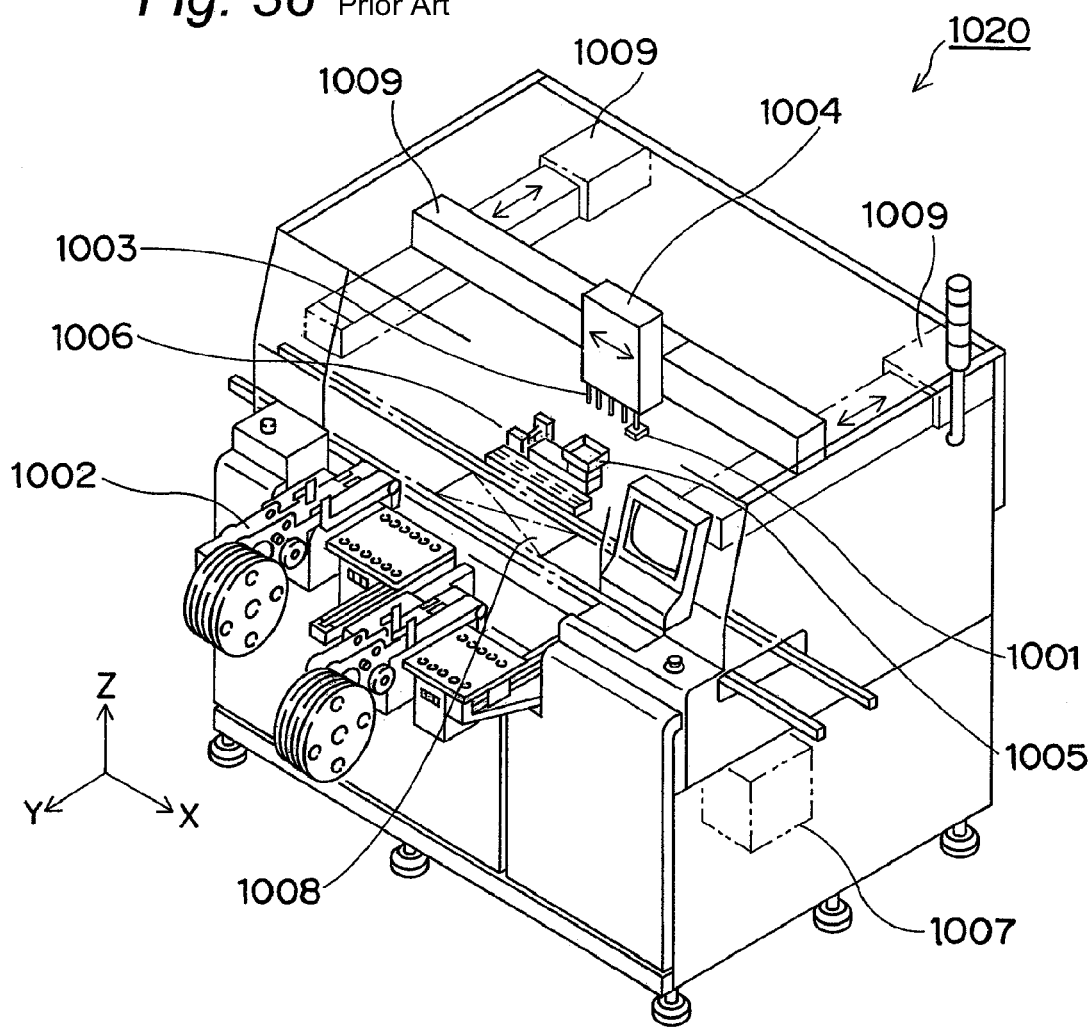
FIG. 36 is a perspective view showing a conventional component mounting apparatus.
Figure 37:
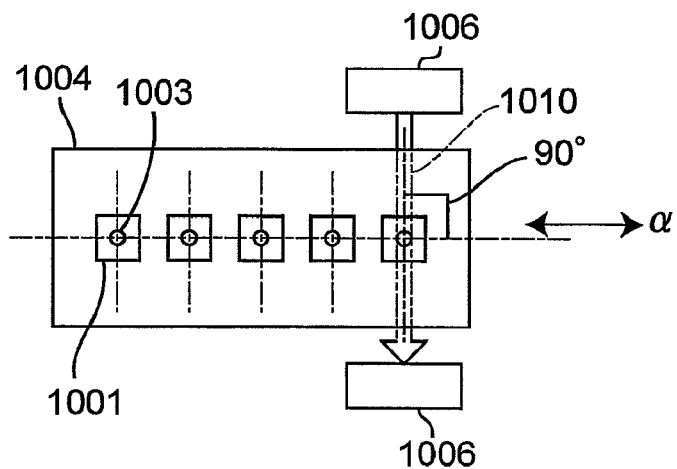
FIG. 37 is a diagram for explaining a height detecting method in the conventional component height detecting unit.
Figure 38:
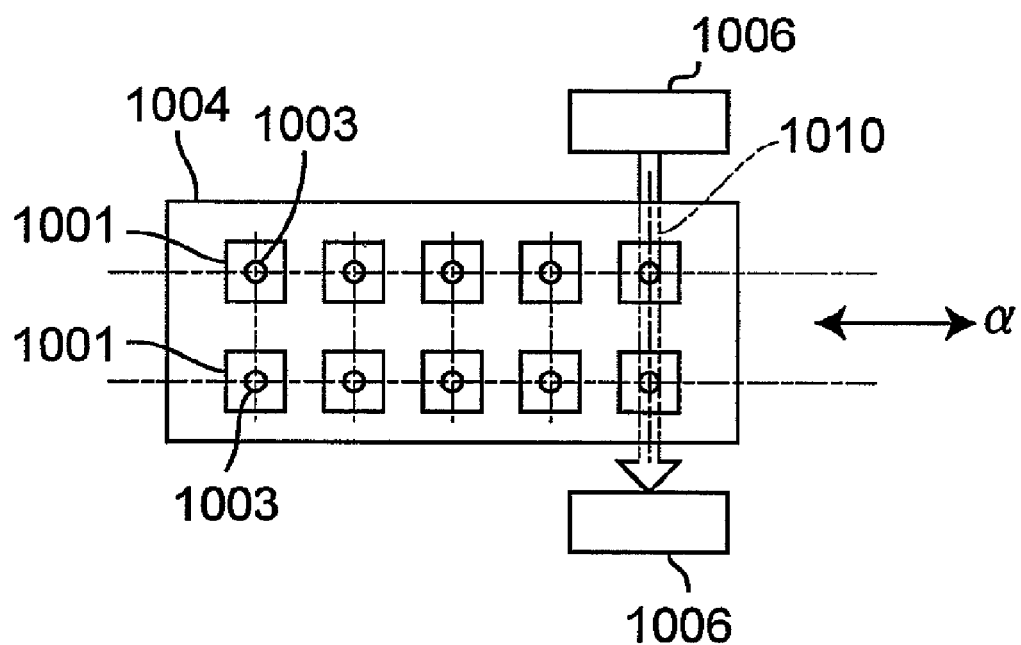
FIG. 38 is a diagram for explaining a height detecting method in a case where component hold members are arranged in plural lines and rows in the conventional component height detecting unit.

The control device 1150 has component hold member height information set beforehand for each component holding member 1121 and component height information set beforehand for each component, since the heights of the component holding members 1121 vary. Therefore, based on the images of the electronic components 1111 to be supplied, the control device 1150 obtains the heights of the images as shown in FIG. 35, and compares defined height information set beforehand by the component holding member height information and the component height information with the component height information obtained. The control device 1150 determines that component hold posture of a component is defective when the component has a result of the comparison exceeding a specified value.

As described above, since there may be a case where images overlap between the respective components, the control device 1150 obtains the component height information based on the image information in the detecting section 1144 within the non-overlapping range 1145 of the image of each of the components 1111. In this way, since the component height information is obtained based on the image information in the detecting section 1144, it is possible to determine in the images received in the light receiving unit 1142 that component height information of which component 1111 is obtained, even in a case where images are overlapped between the adjacent components 1111. As a result, it is possible to speed-up the cycle time relating to mounting of components, comparing with the conventional case.

When the electronic components 1111 are determined as good, that is, when the component holding postures are determined as good in a result of the determination described above, by the operational control of the control device, the component holding head 1120 is positioned on a component mounting position on the circuit board 1161 by the X, Y-robot 1130, and mounts the electronic components 1111 held by the component holding members 1121 on the circuit board 1161.

On the other hand, when the electronic component 1111 is determined as defective, that is, when the component holding posture is determined as defective, with the operational control of the control device 1151, the component holding head 1120 is moved to a disposal place (not shown) by the X, Y-robot 1130 so as to dispose the defective electronic component 1111.

Then, the steps from the component holding operation to the mounting operation are repeated again.

Although, in the tenth embodiment as described above, the moving direction 1124 is set as the X direction and the orthogonal direction 1125 is set as the Y direction, the present invention is not limited to this. The light for detection 1143 in the component height detective device 1140 may be emitted so as to be in parallel with a Y direction, and the component holding head 1120 may be moved so as to define the detectable angle θ.

By combining any embodiments among the various embodiments described above appropriately, it is possible to achieve effects held by the respective embodiments.

Although the present invention has been described sufficiently relating to the preferred embodiments with reference to the accompanying drawings, various deformations and modifications are obvious for those skilled in the art. Such deformations and modifications should be understood to be included in the present invention within the scope of the present invention defined by the scope of claims attached hereto unless they depart therefrom.

What is claimed is:

1. A component mounting apparatus comprising:
   a supplying unit having a plurality of supplying parts for supplying components, said supplying parts being aligned in an X direction;
   a head configured to have at least two nozzle rows aligned in a Y direction orthogonal to the X direction, each of which comprises at least one nozzle arranged in the X direction and configured to take out a component supplied from the supplying unit and to convey the component;
   a circuit board holding unit configured to hold a circuit board on which the component conveyed by the head is mounted; and
   an inspection unit, which is disposed on a moving path of the head from the supplying unit to the circuit board holding unit, configured to inspect a hold posture of the component held by the nozzle,
   the inspection unit comprising:
   a plurality of sensors for posture inspection, the sensors being arranged with respect to the nozzle rows, respectively, and being arranged so that centers of fields of view of the sensors are aligned in the X direction; and
   one lighting unit shared among the sensors, arranged for all nozzle rows and configured to irradiate a light beam to the head at a time of posture inspection, the lighting unit having an entrance port of optical information, the entrance port being shared among the sensors, for taking an image of the component held by the nozzle,
   wherein the head is configured to move in the X direction to perform posture inspection such that a position in the Y direction of each nozzle row arranged on the head and a position in the Y direction of the center of field of view of each sensor coincide with each other.

2. The component mounting apparatus as claimed in claim 1, further comprising:
   a reflecting/transmitting member including a half mirror or prism between the entrance port and the sensors; and
   another sensor disposed at any position corresponding to a transmitted light side of the reflecting/transmitting member where an image is capable to be taken.

3. The component mounting apparatus as claimed in claim 1, wherein the sensors of the inspection unit include sensors of different ranges of vision.

4. The component mounting apparatus as claimed in claim 1, wherein the sensors of the inspection unit include sensors of different resolutions.

* * * * *